(12) United States Patent
Kodim

(10) Patent No.: US 6,522,212 B1
(45) Date of Patent: Feb. 18, 2003

(54) MATCHED CRYSTAL TEMPERATURE COMPENSATION DEVICE

(75) Inventor: Walter Kodim, Nürnberg (DE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 0 days.

(21) Appl. No.: 09/664,921

(22) Filed: Sep. 18, 2000

(30) Foreign Application Priority Data

Sep. 22, 1999 (EP) .............................................. 99118046

(51) Int. Cl.⁷ ................................................. H03L 1/00
(52) U.S. Cl. .................... 331/176; 331/158; 331/116 R; 331/66; 331/74
(58) Field of Search ................................ 331/176, 158, 331/116 R, 66, 74; 310/311

(56) References Cited

U.S. PATENT DOCUMENTS

| 4,893,097 A | 1/1990 | Zwack | 331/176 |
| 5,574,408 A | 11/1996 | Zwack | 331/176 |
| 5,883,550 A | 3/1999 | Watanabe et al. | 331/176 |

FOREIGN PATENT DOCUMENTS

| EP | 0 310 863 A | 4/1989 |
| EP | 0 608 681 A | 8/1994 |
| EP | 0 878 909 A | 11/1998 |

Primary Examiner—Arnold Kinkead
(74) Attorney, Agent, or Firm—Nixon & Vanderhye, PC

(57) ABSTRACT

The invention relates to a device and a method for temperature compensation via the determination of cut-angles of a master and a slave crystal (mc, sc) employed in a master and slave oscillator (m, s). When the master and the slave oscillator (m, s) have been tuned to their center frequencies (fc_m, fc_s), then the temperature characteristic of the slave oscillator (s) is actively detuned with respect to the temperature characteristic of the master oscillator (m). In a detuned state a frequency ratio parameter (n_s) of the slave to the master output frequency (f_s/f_m) is determined and the cut-angle is determined by using this parameter (n_s) to read out the cut-angle dependent on the temperature (T) from a memory (MEM). The invention also relates to a temperature compensation device and method where two crystals of different cut-angles are used and a frequency ratio parameter is determined to determine the identity/symmetry or difference of the cut-angles. Particular useful applications of the invention are in dual-mode mobile telephones which require the use of at least two oscillators with different resonant frequencies.

33 Claims, 17 Drawing Sheets

FIG. 1 PRIOR ART

| INIT.FREQ.DEV. [ppm] | DRIFT OVER TEMP. [ppm] | TEMP.RANGE [°C] | COST + ADDITIONAL COST |
|---|---|---|---|
| +/-30 | +/-50 | -20 to +70 | 100% |
| +/-20 | +/-50 | -20 to +70 | 100 + 10% |
| +/-15 | +/-20 | -20 to +70 | 100 + 100% |
| +/-15 | +/-15 | -20 to +70 | 100 + 300% |
| +/-15 | +/-10 | -20 to +70 | 100 + n.a.% |
| +/-15 | +/-5 | -20 to +70 | 100 + n.a.% |

FIG. 11

| t[°C] | df_m/ fc_m[ppm] | df_s/ fs_s[ppm-] | fc_m[MHz] | fc_s[MHz] | Tc_m[us] | Tc_s[us] | Tc_m[us] | n_s[] |
|---|---|---|---|---|---|---|---|---|
| -55 | 26,8800 | 66,8800 | 13000349 | 12800856 | 0,07692101 | 0,07811978 | 4922,9446 | 63017,9052 |
| -45 | 34,5450 | 69,5450 | 13000449 | 12800890 | 0,07692042 | 0,07811957 | 4922,9069 | 63017,5901 |
| -35 | 37,8000 | 67,8000 | 13000491 | 12800868 | 0,07692017 | 0,07811970 | 4922,8908 | 63017,2750 |
| -25 | 37,2750 | 62,2750 | 13000485 | 12800797 | 0,07692021 | 0,07812014 | 4922,8934 | 63016,9599 |
| -15 | 33,6000 | 53,6000 | 13000437 | 12800686 | 0,07692049 | 0,07812081 | 4922,9115 | 63016,6449 |
| -5 | 27,4050 | 42,4050 | 13000356 | 12800543 | 0,07692097 | 0,07812169 | 4922,9420 | 63016,3298 |
| 5 | 19,3200 | 29,3200 | 13000251 | 12800375 | 0,07692159 | 0,07812271 | 4922,9818 | 63016,0148 |
| 15 | 9,9750 | 14,9750 | 13000130 | 12800192 | 0,07692231 | 0,07812383 | 4923,0278 | 63015,6997 |
| 25 | 0,0000 | 0,0000 | 13000000 | 12800000 | 0,07692308 | 0,07812500 | 4923,0769 | 63015,3846 |
| 35 | -9,9750 | -14,9750 | 12999870 | 12799808 | 0,07692384 | 0,07812617 | 4923,1260 | 63015,0695 |
| 45 | -19,3200 | -29,3200 | 12999749 | 12799625 | 0,07692456 | 0,07812729 | 4923,1720 | 63014,7544 |
| 55 | -27,4050 | -42,4050 | 12999644 | 12799457 | 0,07692519 | 0,07812831 | 4923,2118 | 63014,4394 |
| 65 | -33,6000 | -53,6000 | 12999563 | 12799314 | 0,07692556 | 0,07812919 | 4923,2423 | 63014,1243 |
| 75 | -37,2750 | -62,2750 | 12999515 | 12799203 | 0,07692594 | 0,07812987 | 4923,2604 | 63013,8092 |
| 85 | -37,8000 | -67,8000 | 12999509 | 12799132 | 0,07692598 | 0,07813030 | 4923,2630 | 63013,4941 |
| 95 | -34,5450 | -69,5450 | 12999551 | 12799110 | 0,07692573 | 0,07813043 | 4923,2470 | 63013,1790 |
| 100 | -26,8800 | -66,8800 | 12999651 | 12799144 | 0,07692514 | 0,07813023 | 4923,2093 | 63012,8639 |

| Tinv[°C] = | 25 | dphi [min] | dphi [min] | dphi [min] | dphi [min] |
|---|---|---|---|---|---|
| a1 = | -0,084 | 0 | 4 | -4 | 16 |
| a3 = | 1,05E-04 | 0,000000 | -0,336000 | -0,336000 | -1,344000 |

| Tref[°C] | t[°C] | df/f[ppm]<br>(1)dphi[min]=0 | (2)dphi[min]=4 | (3)dphi[min]=-4 | (4)dphi[min]=16 |
|---|---|---|---|---|---|
| -80 | -55 | -53,7600 | -26,8800 | -80,6400 | 53,7600 |
| -70 | -45 | -36,0150 | -12,4950 | -59,5350 | 58,0650 |
| -60 | -35 | -22,6800 | -2,5200 | -42,8400 | 57,9600 |
| -50 | -25 | -13,1250 | 3,6750 | -29,9250 | 54,0750 |
| -40 | -15 | -6,7200 | 6,7200 | -20,1600 | 47,0400 |
| -30 | -5 | -2,8350 | 7,2450 | -12,9150 | 37,4850 |
| -20 | 5 | -0,8400 | 5,8800 | -7,5600 | 26,0400 |
| -10 | 15 | -0,1050 | 3,2550 | -3,4650 | 13,3350 |
| 0 | 25 | 0,0000 | 0,0000 | 0,0000 | 0,0000 |
| 10 | 35 | 0,1050 | -3,2550 | 3,4650 | -13,3350 |
| 20 | 45 | 08400 | -5,8800 | 7,5600 | -26,0400 |
| 30 | 55 | 2,8350 | -7,2450 | 12,9150 | -37,4850 |
| 40 | 65 | 6,7200 | -6,7200 | 20,1600 | -47,0400 |
| 50 | 75 | 13,1250 | -3,6750 | 29,9250 | -54,0750 |
| 60 | 85 | 22,6800 | 2,5200 | 42,8400 | -57,9600 |
| 70 | 95 | 36,0150 | 12,4950 | 59,5350 | -58,0650 |
| 80 | 105 | 53,7600 | 26,8800 | 80,6400 | -53,7600 |

FIG.4

| t[°C] | df_m/fc_m[ppm] | df_s/fc_s[ppm] | fc_m[Hz] | fc_s[Hz] | Tc_m[us] | Tc_s[us] | T_m[us] | n_s[] | a1(t-Tinv) | a3(t-Tinv)3 |
|---|---|---|---|---|---|---|---|---|---|---|
| -55 | 26,8800 | 26,8800 | 13000349 | 12800344 | 0,0769210 | 0,0781229 | 4922,9446 | 63015,385 | 80,64 | -53,76 |
| -45 | 34,5450 | 34,5450 | 13000449 | 12800442 | 0,0769204 | 0,0781223 | 4922,9069 | 63015,385 | 70,56 | -36,015 |
| -35 | 37,8000 | 37,8000 | 13000491 | 12800484 | 0,0769202 | 0,0781220 | 4922,8908 | 63015,385 | 60,48 | -22,68 |
| -25 | 37,2750 | 37,2750 | 13000485 | 12800477 | 0,0769202 | 0,0781221 | 4922,8934 | 63015,385 | 50,4 | -13,125 |
| -15 | 33,6000 | 33,6000 | 13000437 | 12800430 | 0,0769205 | 0,0781224 | 4922,9115 | 63015,385 | 40,32 | -6,72 |
| -5 | 27,4050 | 27,4050 | 13000356 | 12800351 | 0,0769210 | 0,0781229 | 4922,9420 | 63015,385 | 30,24 | -2,835 |
| 5 | 19,3200 | 19,3200 | 13000251 | 12800247 | 0,0769216 | 0,0781235 | 4922,9818 | 63015,385 | 20,16 | -0,84 |
| 15 | 9,9750 | 9,9750 | 13000130 | 12800128 | 0,0769223 | 0,0781242 | 4923,0278 | 63015,385 | 10,08 | -0,105 |
| 25 | 0,0000 | 0,0000 | 13000000 | 12800000 | 0,0769231 | 0,0781250 | 4923,0769 | 63015,385 | 0 | 0 |
| 35 | -9,9750 | -9,9750 | 12999870 | 12799872 | 0,0769238 | 0,0781258 | 4923,1260 | 63015,385 | -10,08 | 0,105 |
| 45 | -19,3200 | -19,3200 | 12999749 | 12799753 | 0,0769246 | 0,0781265 | 4923,1720 | 63015,385 | -20,16 | 0,84 |
| 55 | -27,4050 | -27,4050 | 12999644 | 12799649 | 0,0769252 | 0,0781271 | 4923,2118 | 63015,385 | -30,24 | 2,835 |
| 65 | -33,6000 | -33,6000 | 12999563 | 12799570 | 0,0769257 | 0,0781276 | 4923,2423 | 63015,385 | -40,32 | 6,72 |
| 75 | -37,2750 | -37,2750 | 12999515 | 12799523 | 0,0769259 | 0,0781279 | 4923,2604 | 63015,385 | -50,4 | 13,125 |
| 85 | -37,8000 | -37,8000 | 12999509 | 12799516 | 0,0769260 | 0,0781280 | 4923,2630 | 63015,385 | -60,48 | 22,68 |
| 95 | -34,5450 | -34,5450 | 12999551 | 12799558 | 0,0769257 | 0,0781277 | 4923,2470 | 63015,385 | -70,56 | 36,015 |
| 105 | -26,8800 | -26,8800 | 12999651 | 12799656 | 0,0769251 | 0,0781271 | 4923,2093 | 63015,385 | -80,64 | 53,76 |

FIG.16b

| t[°C]=const= | 45 |
| --- | --- |

| n_s[] | dphi_m[1/°C] | | | | | | | | |
| --- | --- | --- | --- | --- | --- | --- | --- | --- | --- |
| dphi_s[1/°C] | -8,0 | -6,0 | -4,0 | -2,0 | 0,0 | 2,0 | 4,0 | 6,0 | 8,0 |
| -8,0 | | | | | | | | | |
| -6,0 | | | | | | | | | |
| -4,0 | | | | | | | | | |
| -2,0 | | | | | | | | | |
| 0,0 | | | | | | | | | |
| 2,0 | | | | | | | | | |
| 4,0 | | | | | | | | | |
| 6,0 | | | | | | | | | |
| 8,0 | | | | | | | | | |

| t[°C] = | 25 | | t[°C] = | 45 | |
|---|---|---|---|---|---|
| fc_m[MHz] = | 13,000000 | | fc_m[MHz] = | 12,999749 | |
| fc_s[MHz] = | 12,800000 | | fc_s[MHz] = | 12,799625 | |
| T_m vs. n_m | n_m vs. TIME | n_s vs. TIME | T_m vs. n_m | n_m vs. TIME | n_s vs. TIME |
| 0,0000 | 0 | 0,0000 | 0,0000 | 0 | 0,0000 |
| 307,6923 | 4000 | 3938,4615 | 307,6983 | 4000 | 3938,4222 |
| 615,3846 | 8000 | 7876,9231 | 615,3965 | 8000 | 7876,8443 |
| 923,0769 | 12000 | 11815,3846 | 923,0948 | 12000 | 11815,2665 |
| 1230,7692 | 16000 | 15753,8462 | 1230,7930 | 16000 | 15753,6886 |
| 1538,4615 | 20000 | 19692,3077 | 1538,4913 | 20000 | 19692,1108 |
| 1846,1538 | 24000 | 23630,7692 | 1846,1895 | 24000 | 23630,5329 |
| 2153,8462 | 28000 | 27569,2308 | 2153,8878 | 28000 | 27568,9551 |
| 2461,5385 | 32000 | 31507,6923 | 2461,5860 | 32000 | 31507,3772 |
| 2769,2308 | 36000 | 35446,1538 | 2769,2843 | 36000 | 35445,7994 |
| 3076,9231 | 40000 | 39384,6154 | 3076,9825 | 40000 | 39384,2215 |
| 3384,6154 | 44000 | 43323,0769 | 3384,6808 | 44000 | 43322,6437 |
| 3692,3077 | 48000 | 47261,5385 | 3692,3790 | 48000 | 47261,0658 |
| 4000,0000 | 52000 | 51200,0000 | 4000,0773 | 52000 | 51199,4880 |
| 4307,6923 | 56000 | 55138,4615 | 4307,7755 | 56000 | 55137,9101 |
| 4615,3846 | 60000 | 59076,9231 | 4615,4738 | 60000 | 59076,3323 |
| 4923,0769 | 64000 | 63015,3846 | 4923,1720 | 64000 | 63014,7544 |

FIG.17b  COUNTER STATE vs. TIME AT 25°C

MATCHED CRYSTAL TEMPERATURE COMPENSATION DEVICE

FIELD OF THE INVENTION

The invention relates to a device and a method for temperature compensation by a determination of the cut-angle of crystals used in oscillators. The invention relates also to device and a method for determining the identity (or difference) of the cut-angle of crystals used in oscillators.

In particular, the invention addresses to problems how an effective temperature compensation can be achieved in a clock oscillator without the need of performing an estimation procedure which requires a temperature cycling during a production process. The temperature compensation technique of the present invention is particularly useful for all applications where two clock oscillators each having a crystal are used, e.g. in multistandard applications—one example being a GSM-AMPS dual mode operation). Since the temperature compensation using two "matched crystals" requires two crystals, it is most suitable for applications that need to have two reference frequencies for operation. For example, two reference frequencies in a dual mode subscriber station operating in the GSM and GPS systems, require two different frequencies of 13 MHz and a selected reference frequency (the company SiRF e.g. has selected 24.5525 MHz). However, the invention is not restricted to use in reference oscillators and it may be used for any type of oscillator for any particular application purpose.

Generally, in such crystal oscillators the oscillation frequency temperature characteristic is mainly determined by the resonant frequency temperature characteristic of the respective crystals and the invention is particularly directed to compensate this resonant frequency temperature characteristic of crystal oscillators. However, any other circuit element in the two crystal oscillators can be matched according to the invention in order to cancel out temperature effects of such other circuit components. Therefore, although the invention will hereinafter be explained with reference to the crystal matching of crystals used in oscillators, the inventive concept is generally applicable to matching of other circuit components which determine the resonance frequency temperature characteristic of the oscillators.

BACKGROUND OF THE INVENTION

Crystals (crystal oscillators) are fundamental to radio communication equipment and to many other electronic circuits which require a very stable resonant frequency. The very high quality factor (Q=10000 . . . 5000000) and a small temperature coefficient make them most attractive as the frequency determining elements in frequency oscillator circuits. A particular useful crystal is a AT-cut crystal which covers a fundamental frequency range from 0.5 MHz to 30 MHz. Most of the considerations below are made for the AT-cut crystals, however, it should be noted that the invention is not restricted to this special type of crystal. Other crystal types may be used as well.

When using crystal oscillators in radio communication equipment, the long term stability due to temperature dependent frequency drift is important. Firstly, it is desired that the oscillator keeps a predetermined frequency stable over a long period of time independent from temperature changes. Secondly, if there is a frequency drift due to ambient temperature variations, it is desired that a well defined control is carried out to tune the frequency back to the desired frequency. For doing so, it is necessary to have an exact knowledge of the AT-cut crystal temperature characteristic. Of course, the resonant frequency temperature characteristic of the crystal oscillator is not only determined by the resonant frequency temperature characteristic of the crystal itself but also from additional active circuitry which may be used in the oscillator in addition to the crystal. Hereinafter, it is, however, assumed that the resonant frequency temperature characteristic of the crystal oscillator is mainly dependent on the resonant frequency temperature characteristic of the crystal itself.

DESCRIPTION OF THE PRIOR ART

As already indicated above, in the prior art several solutions are available in order to obtain a well defined temperature characteristic of a crystal. The temperature characteristic must be known also to perform the temperature compensation in case the temperature changes during operation. FIG. 1 shows an overview of the relation between the available temperature range, initial frequency deviation, frequency drift over temperature and cost for a standard 13 MHz crystal. As shown in FIG. 1, a small initial frequency deviation and a small frequency drift over temperature may only be obtained at very high cost. For reasonable costs (see the first line for 100% cost) a quite large initial frequency deviation of ±30 ppm and a large drift over temperature of ±50 ppm must be expected. Whilst the selection of a crystal with a low frequency drift over temperature may be a straight forward solution to build crystal oscillators with low frequency drift over temperature, this approach is certainly a very highly cost intensive one.

As already explained above, instead of just selecting a crystal at very high cost, an alternative approach is to select a moderately priced crystal and to provide the oscillator with a frequency control input (e.g. voltage controlled) and use this frequency control input as a temperature dependent control signal to apply a control voltage tuning the frequency of the oscillator back to the desired frequency dependent on the temperature changes. For example, a voltage controlled variable capacitor can be used in the oscillator circuit in order to pull the resonance frequency (frequencies) of the crystal and thus of the oscillator back to the desired frequency. Using voltage controlled crystal oscillators, different temperature compensation principles can be distinguished.

A first approach uses a pre-detuned control signal voltage, where pre-detuning is a function of the temperature and where the pre-detuning is selected to counteract the frequency drift of the crystal. Such temperature dependent control signals can for example be generated by a NTC/PTC resistor network.

For a digitally compensated crystal, the temperature response of the crystal (if known) is digitized and stored in a look-up table. The control voltage used for tuning the resonant frequency of the oscillator is adjusted according to the current ambient temperature which is sensed by a temperature sensor and the values stored in the look-up table. Both types of crystal oscillators are widely used and are known as VCTCXO and DCTCXO.

Two further solutions for achieving a temperature compensations of crystals (or crystal oscillators) are to place the crystals (or the crystal oscillators) into a temperature controlled oven. Since the temperature is usually kept constant well above the maximum ambient temperature, the crystal itself is operating at a constant temperature and hence independent of the ambient temperature. This achieves a lowest temperature dependent frequency drift.

Another approach is to use a feedback loop to compensate temperature effects. In this case, the crystal oscillator is synchronized to a common frequency standard (master clock) like the DCF77 or is synchronized to a base station like in the GSM system. That is, crystal oscillators used in such feedback loops (e.g. in a GSM network) may use the network reference for temperature compensation purposes assuming that the network reference is available and stable whenever the temperature compensation is required.

Whilst usually the temperature dependent resonance frequency drift is unwanted and a temperature compensation is applied to retune the resonant frequency, an advantageous use of the temperature dependent frequency drift is for temperature sensing purposes where a strong temperature dependence of the resonant frequency is desirable. However, obviously for performing a precise tuning of the resonant frequency or for an accurate temperature measurement, a precise knowledge about the frequency drift versus temperature is necessary. That is, the more precise the temperature characteristic of the crystal is known (measured), the better the temperature compensation or the temperature sensing will be. However, as will be explained below, it is difficult or at least cost intensive to have such a precise knowledge of the temperature characteristic of the crystal when it is purchased from the manufacturer.

AT-CUT CRYSTAL TEMPERATURE CHARACTERISTIC

A crystal can be regarded as a thickness-shear vibrator in which all oscillators knots are located inside the resonator. For a large resonator and small electrodes all the oscillator energy is focused at the center of the disc, i.e. a low damping fixture of the crystal at its circumference. The resonance frequency is then determined mainly by the effective elasticity and the resonant frequency of the fundamental mode in an AT-cut crystal can be expressed as f=1.660/d where d is the thickness of the crystal disc. Generally, the temperature characteristic of such an AT-cut crystal is a third order curve with an inflection point which lies typically between 25° C. and 35° C. depending on the actual cut-angle and the mechanical construction of the crystal disc. The third order temperature characteristic df/f generally expressed as $$df/f = A1(T-Tref) + A2(T-Tref)^2 + A3(T-Tref)^3 \quad (1)$$

can be reduced if one refers to the inflection point temperature Tinv instead of the initial temperature Tref leading to $$df/f = a1(T-Tinv) + a3(T-Tinv)^3 \quad (2)$$

where:

$$df/f\ [ppm] = (f(T) - f(Txx))/f,$$

Txx=Tref,

Txx=Tinv, frequency deviation a3=1.05E-5 a1=−0.84*dphi dphi=phi__zz−phi__0 phi__zz=cut-angle phi__0=zero angle

T=temperature

Tinv=inflection point temperature

Tref=reference temperature

As can be seen from equation (2), the steepness of the inversion point depends on the cut-angle (phi__zz) of the crystal. dphi is the difference between the cut-angle and a so-called zero angle phi__0 where the temperature characteristic has a horizontal tangent at the inflection point. By the choice of the appropriate cut-angle, two inversion points appear in the temperature characteristic, a maximum below Tinv and a minimum above Tinv. The temperature gradient is zero at each of these inversion points. Furthermore, the crystal diameter and the crystal surface curvature affect the temperature characteristic and the inflection point temperature. FIG. 2 and FIG. 3 are a look-up table and a graph, respectively, showing values of df/f according to equation (2) for different values of the angle dphi (and therefore also implicitly for the cut-angle).

For example, if the cut-angle dphi (actually dphi is the difference value, however, for simplicity hereinafter dphi is also called the cut-angle and it is assumed that the zero angle phi__0 is known) is known to be −4 and the temperature is 5° C. a frequency deviation of −7.5600 ppm occurs and—by applying a control signal to a voltage controlled oscillator—this frequency deviation could be appropriately compensated to retune the oscillator to the desired center frequency. For example, if an oscillator having a tuning sensitivity of 1 ppm/volt is used, then a control voltage of −7.5600 volt would have to be applied.

When buying a crystal from the manufacturer, many parameters of the crystal such as the diameter and the thickness can be predetermined. However, the only thing that is not precisely known, but is needed for a precise temperature compensation is the cut-angle since it can not be measured on the crystal itself. Therefore, the actual temperature characteristic of the crystal is not known. More specifically, if the cut-angle was known immediately the temperature characteristic would also be known and the temperature compensation could be carried out. Since it is not known other techniques must be used in order to determine the actual temperature frequency characteristic of the crystal as will be explained below.

DETERMINATION OF THE AT-CUT CRYSTAL FREQUENCY DRIFT

For the determination of the frequency drift of an AT-cut crystal over a temperature range it is usually sufficient to measure the frequency deviation at three different temperatures. For higher accuracy, five or even more different temperature points are needed. The overall temperature response can be derived by an interpolation technique. Additional tuning steps can be used in order to optimize the overall temperature characteristic of the crystal and the predistortion network, e.g. in NTC/PTC network compensated oscillators or digitally compensated oscillators. The tuning process is needed because the desired temperature characteristic of the crystals may not be preserved over large numbers of devices and furthermore NTC/PTC network is affected by tolerances.

Frequency measurements carried out at different temperatures are, however, time-consuming and require suitable equipment which makes temperature compensated crystal oscillators considerably more expensive than ordinary oscillators. Furthermore, the temperature characteristic of the crystal must be matched to the predistortion network by a tuning or trimming process in order to achieve an improved overall temperature characteristic. This can be very tedious and can require several steps in the production process and therefore adds undesirable costs to the product.

SUMMARY OF THE INVENTION

As explained above, the determination of the resonant frequency temperature characteristic df/f of a crystal is essential in order to perform an accurate temperature compensation or an accurate temperature sensing procedure. However, the exact determination of this temperature characteristic and a corresponding tuning network may increase the cost or may even be inaccurate since it is not possible to measure the frequency temperature characteristic with high accuracy. On the other hand, if the cut-angle was known then the look-up table in FIG. 2 or a graph in FIG. 3 or in fact the numerically stored equation (2) could be used for an accurate determination of the temperature characteristic and thus for a highly precise temperature compensation and temperature sensing. However, the cut-angle of the selected crystal can not be measured as such.

A first object of the invention is to provide a device and a method for determination the cut-angle of crystals in order to allow a highly precise temperature compensation in oscillators.

A second object of the invention is to provide a device and a method which allow to determine the difference or identity of the cut-angles of crystals selected from different batches.

The first object is solved by a device for temperature compensation via a determination of the cut angle of crystals used in oscillators, comprising a first crystal oscillator including a first crystal, which is cut under an angle and which has a first resonant frequency temperature characteristic, adapted to output a first oscillation frequency with a first oscillation frequency temperature characteristic determined by said first resonant frequency temperature characteristic, and including a first tuning means for tuning said first oscillation frequency in response to a first control signal, said first tuning means tuning said first oscillation frequency to a predetermined first center frequency when said first control signal has a first default value, at least one second crystal oscillator including a second crystal which is cut under the same angle as said first crystal and which thus has the same resonant frequency temperature characteristic as said first crystal, adapted to output a second oscillation frequency with a second oscillation frequency temperature characteristic and including a second tuning means for tuning said second oscillation frequency in response to a second and third control signal said second tuning means tuning said second oscillation frequency to a predetermined second center frequency when said second control signal has a second default value, and said second oscillation frequency temperature characteristic being identical to said first oscillation frequency temperature characteristic when said third control signal is disabled and being detuned thereto when it is enabled, a second crystal oscillator setting means for enabling and setting said third control signal to a control value dependent of a temperature, a processing means including a first/second control signal setting means for setting said first control signal and said second control signal to their default values, at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature value, a memory means for storing a known relationship of the frequency ratio parameter dependent on the temperature and the cut angle and an access means for accessing said memory means with said temperature and said determined frequency ratio parameter and for reading out the cut angle corresponding thereto.

Furthermore, the first object is solved by a method for temperature compensation via a determination of the cut angle of crystals used in a first and at least one second crystal oscillator having a first tuning means and a second tuning means for tuning the first and second oscillation frequencies in accordance with a first and a second and a third control signal, wherein the first oscillation frequency temperature characteristic and the second oscillation frequency temperature characteristic are identical when said third control signal is disabled and are different if said first control signal is enabled, comprising the following steps: storing in a memory means a known relationship of a frequency ratio parameter dependent on the temperature and the cut angle, disabling said third control signal and tuning said first and said second oscillation frequencies to their center frequencies by setting the first and the second control signals to default values, enabling said third control signal on and setting said third control signal to a control value dependent of a temperature, measuring the first oscillation frequency and the second oscillation frequency and determining a frequency ratio parameter representing the ratio of the second to the first oscillation frequency, accessing the memory means with said determined frequency ratio parameter and said temperature and reading out the cut angle corresponding thereto.

The second object is solved by a device for determining the identity of the cut angle of crystals used in oscillators, comprising: a first crystal oscillator including a first crystal, which is cut under an angle and which has a first resonant frequency temperature characteristic, adapted to output a first oscillation frequency with a first oscillation frequency temperature characteristic determined by said first resonant frequency temperature characteristic, and including a first tuning means for tuning said first oscillation frequency in response to a first control signal, said first tuning means tuning said first oscillation frequency to a predetermined first center frequency when said first control signal has a first default value; a second crystal oscillator including a second crystal which is cut under an angle and which has a resonant frequency temperature characteristic; adapted to output a second oscillation frequency with a second oscillation frequency temperature characteristic; and including a second tuning means for tuning said second oscillation frequency in response to a second control signal, said second tuning means tuning said second oscillation frequency to a predetermined second center frequency when said second control signal has a second default value; said second oscillation frequency temperature characteristic being different to said first oscillation frequency temperature characteristic due to a difference in cut-angle of the first and second crystals; a processing means including a first/second control signal setting means for setting said first control signal and said second control signal to their default values; a frequency ratio determining means for determining a frequency ratio parameter representing the frequency ratio of said second oscillation frequency to said first oscillation frequency at a measurement temperature different to the inflection point temperature of the crystals; memory means for storing a known relationship of the frequency ratio parameter dependent on the cut-angle of the first crystal and the cut-angle of the second crystal at said measurement temperature; an access means for accessing said memory means with said determined frequency ratio parameter and for reading out the cut angles of the first and second crystal corresponding thereto; and a calibration means for determining the identity of the cut-angles on the basis of the read out first and second crystal cut-angles.

Furthermore, the second object is solved by a method for determining the identity of the cut angle of crystals used in a first and a second crystal oscillator having a first tuning means and a second tuning means for tuning the first and second oscillation frequencies in accordance with a first and a second control signal, comprising the following steps: setting said first control signal and said second control signal to default values for tuning the first and second oscillation frequencies to their center frequencies; storing a known relationship of the frequency ratio parameter dependent on the cut-angle of the first crystal and the cut-angle of the second crystal at said measurement temperature in a memory means; measuring the first oscillation frequency and the second oscillation frequency and determining a frequency ratio parameter representing the ratio of the second to the first oscillation frequency at a measurement temperature different to the inflection point temperature of the crystals; accessing said memory means with said determined frequency ratio parameter and reading out the cut angles of the first and second crystal corresponding thereto; and determining the identity of the cut-angles on the basis of the read out first and second crystal cut-angles.

The object of the invention is also solved by claims 26, 27, 28, 29, 30, 31, 32, 33. According to a first aspect of the invention a "matched crystal concept" is used, i.e. the of use two crystals with identical (but unknown) cut-angles which have the same temperature characteristic such that the resonant frequency versus temperature characteristic will be identical. A first and second oscillator are used each having a crystal with the identical cut-angle but with different resonant frequencies. Since both crystals have identical cut-angles, the temperature characteristic of the first and second oscillator will be the same, however, without the knowledge of the cut-angle itself the temperature characteristic cannot be known. A third control signal is applied to the second oscillator to cause an intentional detuning of the temperature characteristic of the second oscillator with respect to the frequency characteristic of the first oscillator. A frequency ratio parameter of the resonant frequency of the first oscillator to the resonant frequency of the second oscillator in the detuned state is used to read out the cut-angle from a memory at the temperature which corresponds to the setting of the third control signal. The determined cut-angle can then be used to determine the temperature compensation needed.

Therefore, the information about the cut-angle is essentially derived by actively detuning the temperature characteristic of the second oscillator with respect to the first oscillator and a parameter is determined which essentially corresponds to the difference of the two temperature characteristics.

According to the second aspect of the invention, if two oscillators are used having two different crystals with different cut-angles (i.e. not from the same batch), the frequency ratio parameter is determined at a measurement temperature and based on the determined frequency ratio parameter the difference of the cut-angle and/or the identity (symmetry), respectively, of the two crystals can be determined.

Further advantageous embodiments and improvements of the invention can be taken from the dependent claims. However, it should be noted that the invention also comprises embodiments consisting of features which have been separately described in the description and the claims. Therefore, what will be presented below is only the preferred mode of the invention as presently conceived by the inventors. Further advantageous embodiments can be derived by the skilled person on the basis of the teachings and the disclosure herein.

BRIEF DESCRIPTION OF THE DRAWINGS

FIG. 1 shows a typical relative pricing table for crystals with different characteristics according to the prior art;

FIG. 4 shows the slave counter state n_s for various temperatures when two crystals with identical cut-angles and thus identical temperature characteristic are used in a circuit of FIG. 5;

FIG. 11 shows a table corresponding to FIG. 10 and showing different frequency ratio parameters n_s depending on the temperature.

FIG. 16b shows the contents of the memory MEM in FIG. 15;

FIG. 17b shows the values n_s, n_m for 25° C. according to FIG. 17a;

FIG. 17c shows the values n_s, n_m at 45° C. according to FIG. 17a; and

In the drawings the same or similar reference numerals denote the same steps or features.

PRINCIPLE OF THE INVENTION

Figures 2, 3:
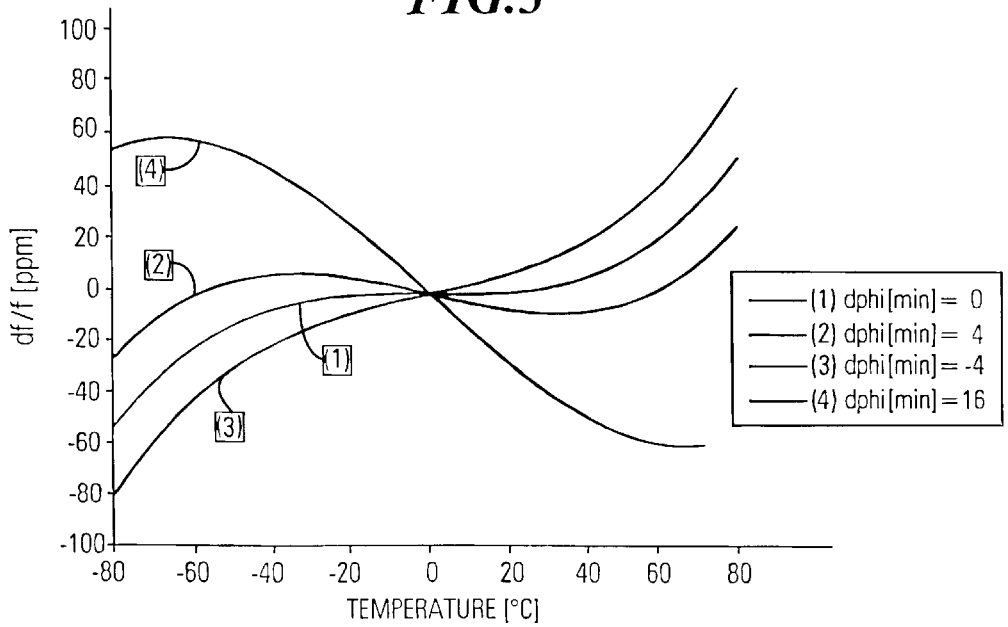
FIG. 2 shows a table representation of equation (2) of a general temperature characteristic of an AT cut crystal.
FIG. 3 shows a graphical representation of equation (2) corresponding to the table representation in FIG. 2.

Before describing in detail embodiments of the invention, hereinafter some general considerations are made in order to facilitate understanding the core aspects of the invention. As explained above, it is impossible to determine the cut-angle which is necessary for determining the temperature characteristic from measurements only on a single crystal. The "matched crystal concept" according to the invention uses at least two crystals with identical cut-angles which hence have the same temperature characteristic. It is assumed that when identical crystals are used in a respective oscillator circuit, then—due to the identical cut-angle—the temperature characteristic of the respective oscillators will be the same and will be mainly determined by the temperature characteristic of the crystal. That is, of course other components in the oscillators may also influence the temperature characteristic. However, it is mainly the crystals's temperature characteristic which determines the output temperature characteristic of the resonant frequency of the oscillators. Hereinafter, it is however, assumed that the temperature dependent characteristic of the oscillator is only determined by the temperature characteristic of the crystal which itself is basically determined by the cut-angle.

Although the principle of the invention and the embodiments will be described with respect to the determination of a cut-angle of crystals in a oscillator, the concept of the invention can also be used for the determination of temperature characteristic of other components in the oscillators.

The "matched crystal concept" according to the invention is based on the realization that for two crystals being taken from the same batch (i.e. the same slices of block of raw material), the temperature characteristic of the crystals will still not be known, but it will be known that both crystals have to a high degree an identical temperature characteristic. On the other hand, the resonant frequency of both crystals is determined by the thickness d of the crystal and it is assumed that at least two crystals have a different thickness and thus different crystal resonant frequency.

Hereinafter, although the concept of the invention is not restricted to the usage of only two crystals (crystal oscillators) and also more than two crystals (crystal oscillators) may be used, for explanation purposes only two crystals are considered. Purely for definition purposes, one crystal will be called the "first or master" crystal and the other one will be called the "second or slave" crystal.

The temperature compensation technique is based on performing a frequency or more precisely a frequency ratio measurement which can be used to determine the temperature dependent frequency drift of the crystals. The basic concept is to detune the master crystal or the master crystal oscillator temperature characteristic with respect to the slave crystal or slave crystal oscillator and to determine the cut-angle on the basis of the frequency ratio measurements. For understanding the invention it is first illustrative to consider a circuit in FIG. 5 where frequency ratio or frequency measurements are carried out. FIG. 4 is a table which shows an example of the relative frequency deviations $df\_m/fc\_m$ and $df\_s/fc\_s$ and the deviation of the center frequency $fc\_m$ and $fc\_s$ with respect to the value $n\_s$ obtained with the circuit in FIG. 5 and furthermore the values $Tc\_m$, $Tc\_s$ which will be explained below.

Figure 5:
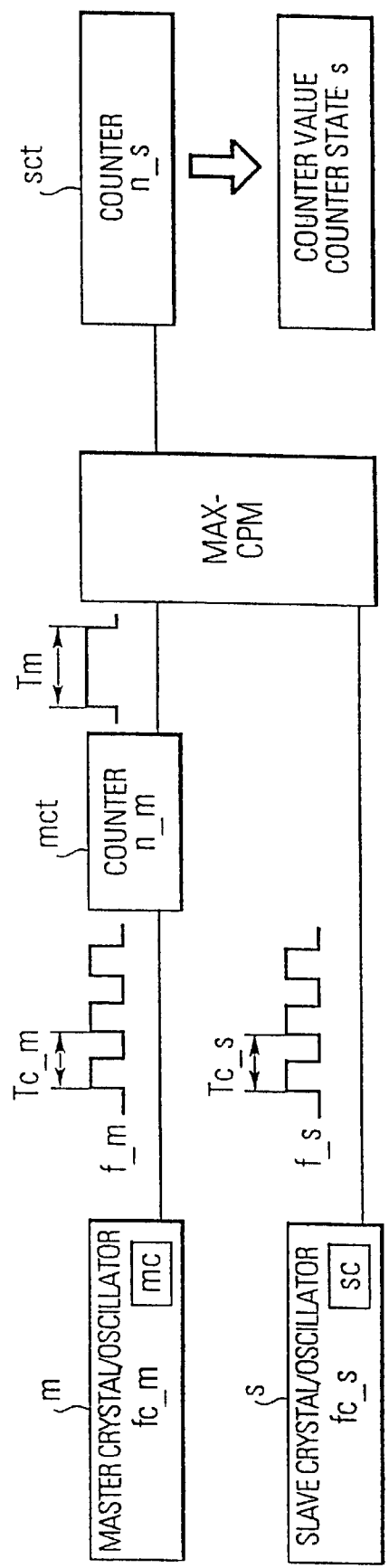
FIG. 5 shows a device for obtaining frequency ratio parameters by reading out the slave counter value n_s from a slave counter set.

In the circuit in FIG. 5 a master (first) crystal oscillator m includes a master crystal mc which is cut under an angle and which has a master resonant frequency temperature characteristic. The master crystal oscillator m is adapted to output a master oscillation frequency $f\_m$ with a master oscillation frequency temperature characteristic $d\_m/fc\_m$ as determined by the master resonant frequency temperature characteristic. Likewise, the slave crystal oscillator s comprises a slave crystal sc which is cut under the same angle as said master crystal mc and which thus has the same resonant frequency temperature characteristic as said master crystal. The slave crystal oscillators outputs a slave oscillation frequency $f\_s$ with a slave oscillation frequency temperature characteristic $df\_s/fc\_s$. Since the master and the slave crystals are cut under the same angle, they possess the same temperature characteristic as identified with the aforediscussed equation (2) which is here repeated for completeness:

$$df/f = a1(T-Tinv) + a3(T-Tinv)^3 \qquad (2)$$

In FIG. 5 the thickness of the master crystal and the slave crystal is different and as an example for obtaining the values in FIG. 4 the following values where used:

$fc\_m$: (25° C.)=13.000: resonant frequency (3.1)

(master crystal) given at 25° C.;

$n\_m$: 64000 max_counter_state_m (3.2)

$fc\_s$: (25° C.)=13.800: resonant frequency (3.3)

(slave crystal) given at 25° C.;

dphi: 12 difference between cut (3.4)

angle and zero angle a1=1.008 linear coefficient (3.5)

a3=1.05E-04 cubic coefficient (3.6)

Tinv=25 inflection temperature (3.7)

$d\_m$=0.1277 resonator thickness (3.8)

(master crystal)

$d\_s$=0.1297 resonator thickness (3.9)

(slave crystal)

Essentially, the operation in FIG. 5 is as follows. The master counter mct divides the frequency $f\_m$ by the master count value $n\_m$. That is, the output of the master counter mct is set and reset, respectively, after counting $n\_m$ pulses of the master crystal oscillator m. Therefore, the master counter output period Tm is larger than the master crystal oscillator period $Tc\_m$. The maximum comparison means MAX-CPM passes the slave crystal oscillator output pulses to the slave counter sct only within the gating period Tm. At the end of the gating period Tm the counter value $n\_s$ is read out from the slave counter sct and the slave counter sct is reset. A number of values $n\_s$ are determined for different temperatures applied to the master and slave oscillators m, s. FIG. 4 shows a table of values obtained for the aforementioned parameters in equations (3.1)–(3.9). The values in FIG. 4 obtained with the operation of the circuit in FIG. 5 can be calculated as follows:

$fc\_x$ [Hz] $(T) = fc\_x(25° C.)*(1+df\_x/fc\_x)$ (4.1)

$Tc\_m = 1/fc\_m$ master clock period (4.2)

$T\_m = n\_m * Tc\_m$ time for $n\_m$ clock cycles i.e. gate time $Tc\_s = 1/fc\_s$ slave clock period (4.3)

$T\_s = n\_s * Tc\_s$ time for $n\_s$ clock cycles (4.4)

$n\_s = T\_m / Tc\_s$ counter_state_s after $T\_m$ (4.5)

It should be noted that in FIG. 4, FIG. 5 equation (2) is valid for the master and the slave crystal temperature characteristic since both have the same cut-angle and no additional detuning is performed. However, since the temperature characteristic of the master crystal and the slave crystal is identical, the ratio n__s between the master and the slave clock frequency does not change even if both crystals are shifted relative in frequency by the same amount (due to the different temperatures applied) since df__m/fc__m=df__s/fc__s. Therefore, if the crystals are sufficiently matched (in the cut-angle), the slave crystal frequency is always pulled in such a way that the ratio of the master frequency and the slave frequency (i.e. n__s) remains the same over temperature, i.e. n__s is constant over temperature. Furthermore, there is a linear relationship between the time and accuracy, i.e. the longer the gate time Tm, the more accurate, is the ratio between the two frequencies.

Figure 6:
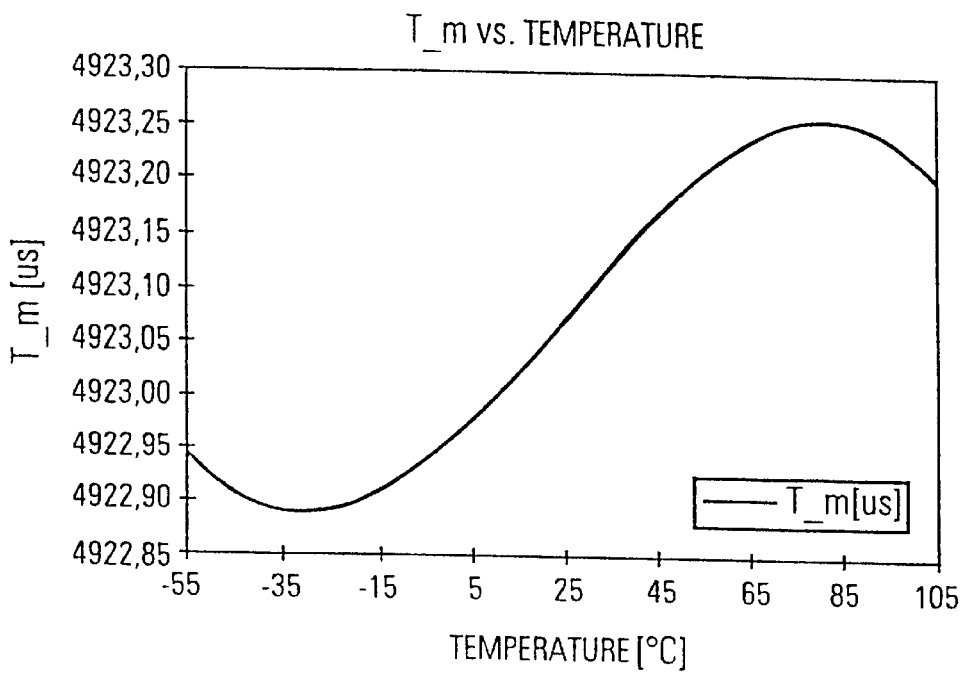
FIG. 6 shows the gating time T_m versus temperature measured in the circuit of FIG. 5.

As shown in FIG. 6, of course the temperature characteristic of the gate time T__m changes dependent on the temperature since the frequency of the master crystal oscillator fc__m changes with temperature and therefore the master counter mct needs dependent on the temperature more or less time to count up to the maximum count value n__m. Comparing FIG. 6 and FIG. 3, since the frequency increases for lower temperatures, the master counter mct counts up to the maximum value faster and therefore T__m is smaller. Likewise, for higher temperatures the resonant frequency fc__m decreases and it therefore takes more time for the master counter mct to count up to its maximum value resulting in a longer gating time T__m.

An important conclusion can be drawn from FIG. 4. Essentially, the slave counter value n__s represents a frequency ratio of the slave oscillation frequency f__s to the master oscillation frequency f__m output by the master and slave crystals oscillators m, s. However, from FIG. 4 it can be seen that all parameters in the table except for the parameter n__s actually change—as expected—with a change of the temperature t. It is only the frequency ratio parameter n__s which actually remains constant. Of course, nothing is actually gained because the value n__s remains constant over temperature and can therefore not be directly related to a particular frequency deviation or temperature t. Furthermore, as also expected the relative deviations df__m/fc__m and df__s/fc__s are identical due to the crystals having the identical cut-angle. That is, even if a different pair of crystals having a different cut-angle with respect to one use in FIG. 4 is employed, the result would still be similar as in FIG. 4, namely the relative frequency deviations may be different, however, n__s would still be constant, i.e. independent of the temperature. The underlying idea of the present invention is to make the frequency ratio n__s dependent on the temperature. However, if both crystals have the same cut-angle (which is to be determined) than the idea of the present invention is to realize a temperature dependent counter state of the slave counter to perform an artificial detuning of the temperature characteristic and to prerecord in a memory a table relating the frequency ratio parameter n__s with the temperature t and the cut-angle dphi. This table can be established by inserting a set of crystals with a particular cut-angle in the circuit in FIG. 5 and measuring or calculating the frequency ratio parameters when a detuning corresponding to predetermined temperatures is applied.

Thus, by artificially detuning the identical temperature characteristics of the master and slave crystal (oscillator), information can be gained on the cut-angle by accessing the table and thus via the cut-angle the temperature characteristic can be determined according to equation (2) and by referring to the table in FIG. 2.

This procedure of detuning the frequency characteristic will hereinafter be explained with reference to the first embodiment of the invention.

FIRST EMBODIMENT

Figure 7:
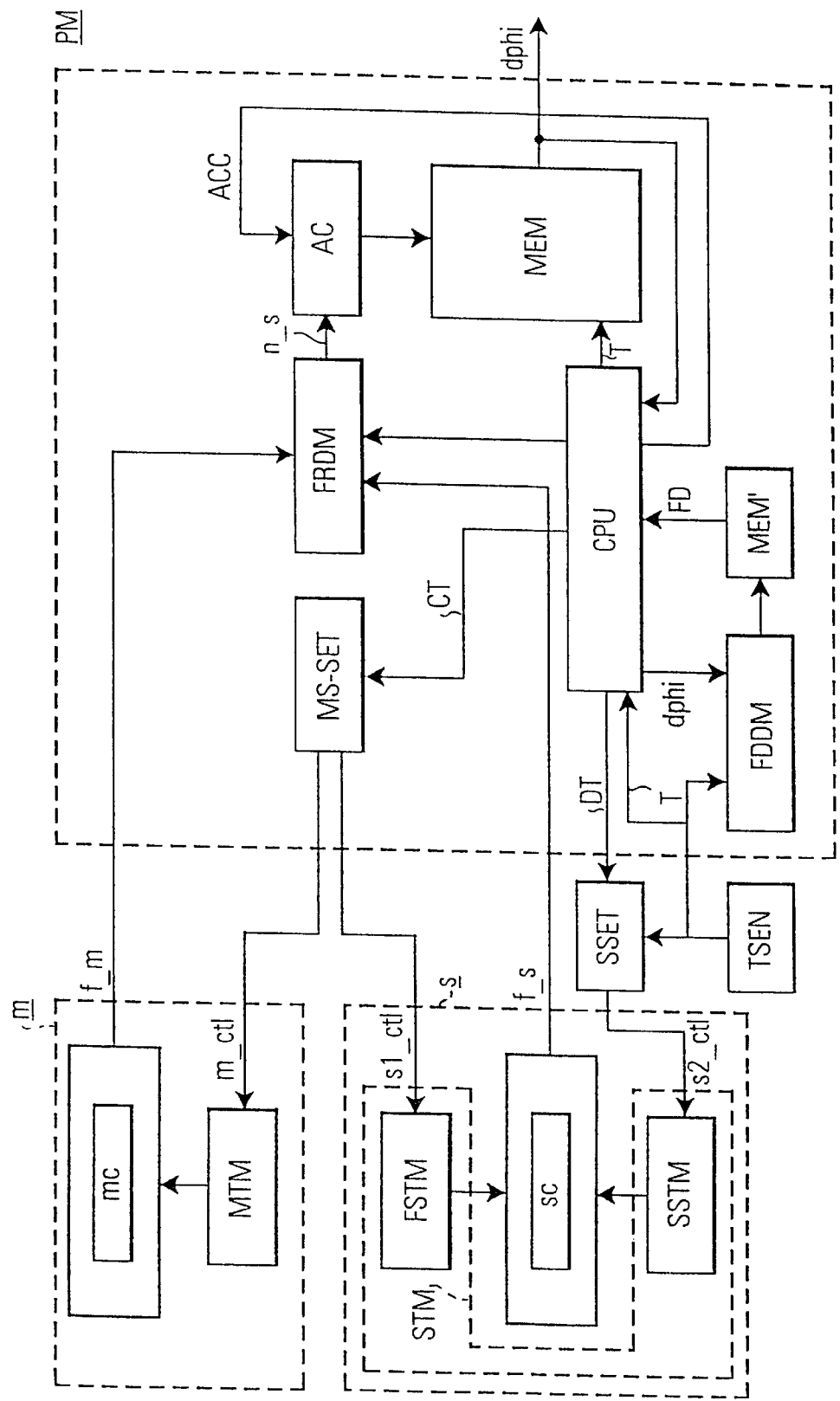
FIG. 7 shows a device for temperature compensation via the determination of the cut-angle according to a first embodiment of the invention.

FIG. 7 shows a first embodiment of a device for temperature compensation via a determination of the cut-angle of crystals used in oscillators according to the invention. This embodiment is based on the above described principle, i.e. to realize a temperature dependent counter state (frequency ratio) of the slave counter which is needed for the estimation of the temperature characteristic of the crystals, an additional temperature coefficient is added to the slave crystal oscillator and the frequency ratio parameter n__s is precalculated for various combinations of cut-angles and temperatures as shown in FIG. 12.

The operation principle of the device in FIG. 7 is similar to the operation principle in FIG. 5. However, in FIG. 7 the slave crystal oscillator temperature characteristic has been detuned with respect to the temperature characteristic of the master crystal oscillator and additional units and memories have been added for determining the cut-angle dphi.

Figure 8:
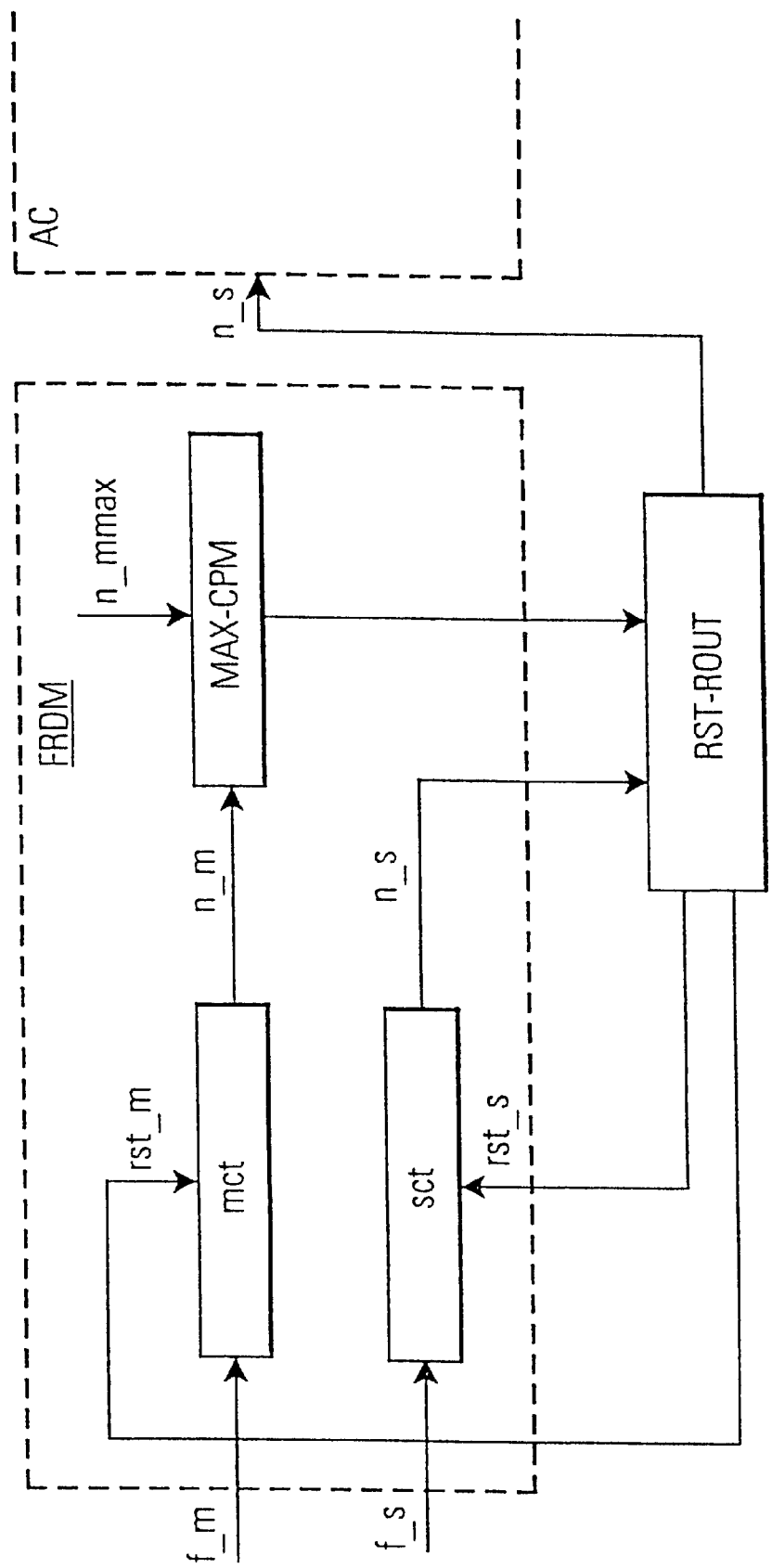
FIG. 8 shows an embodiment of the frequency ratio determining means FRDM in FIG. 7.
Figure 9A:
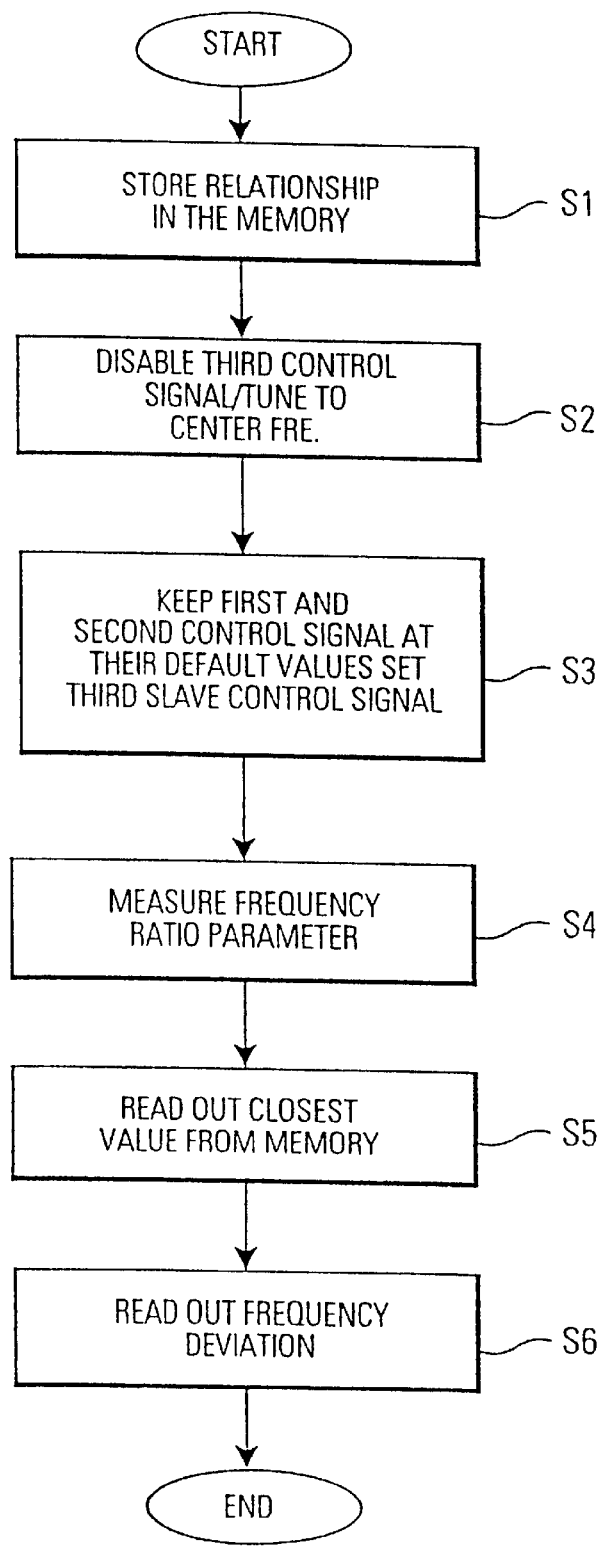
FIG. 9a shows a flow chart for temperature compensation according to the first embodiment of the invention.
Figure 9B:
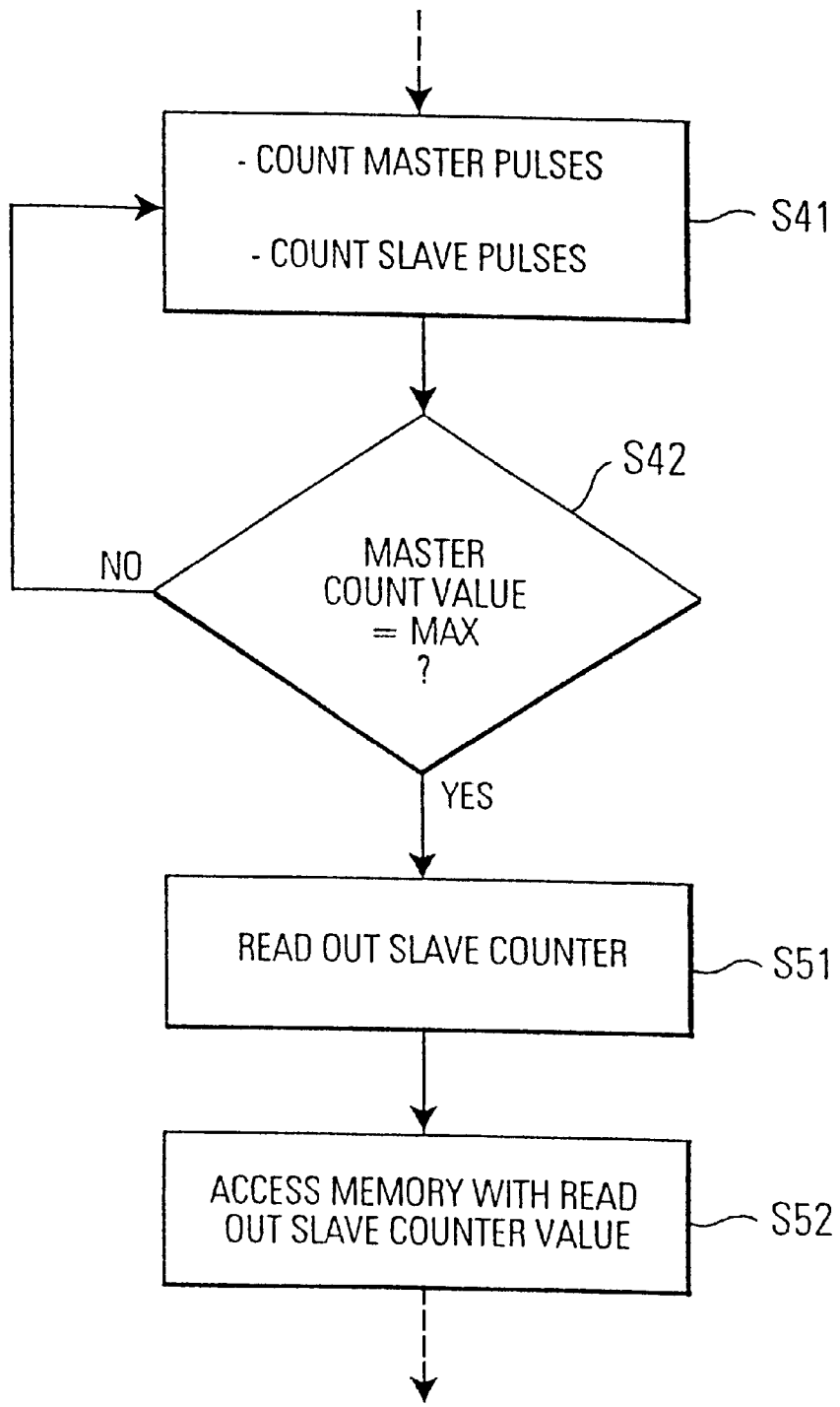
FIG. 9b shows a flowchart for determining the frequency ratio parameter n_s when using a circuit as in FIG. 8.
Figure 10:
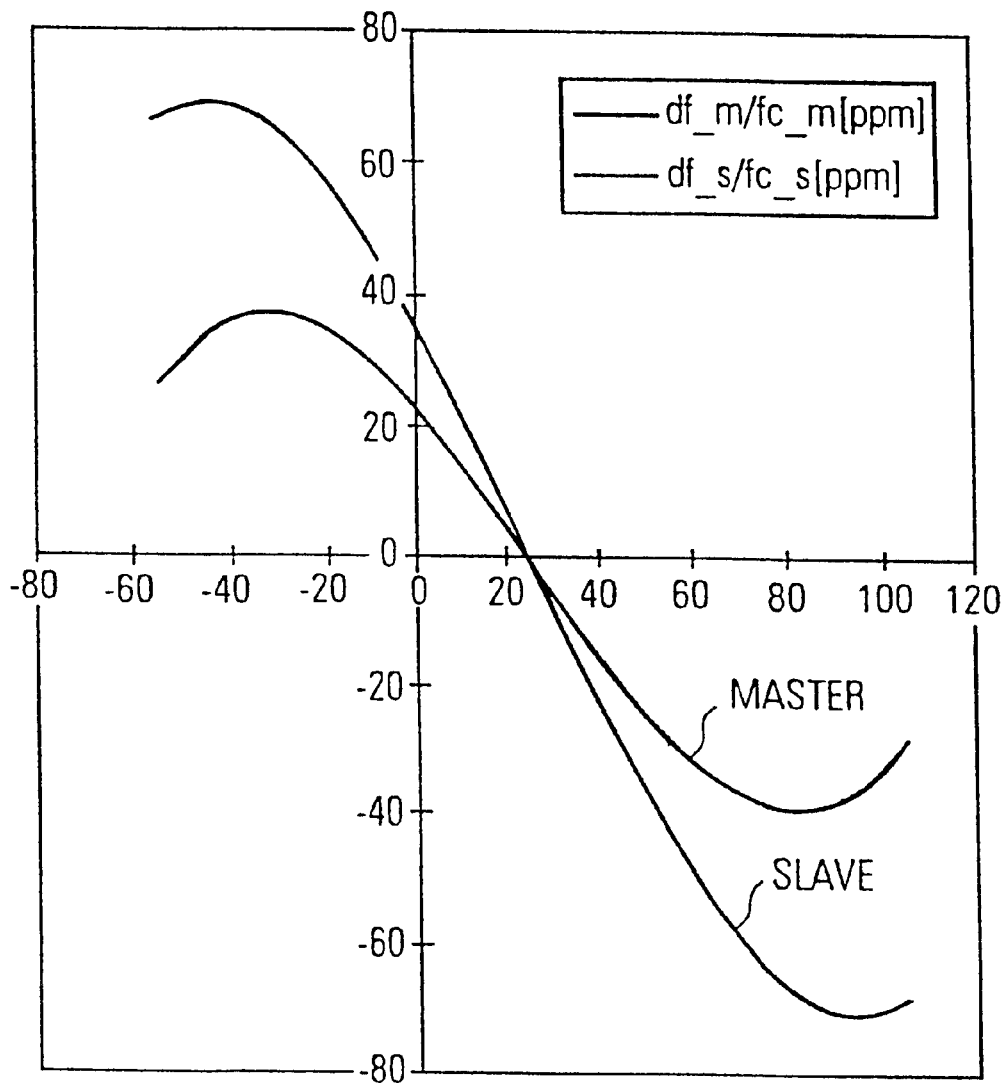
FIG. 10 shows a slave resonant frequency temperature characteristic detuned with respect to a master resonant frequency temperature characteristic.
Figure 12:
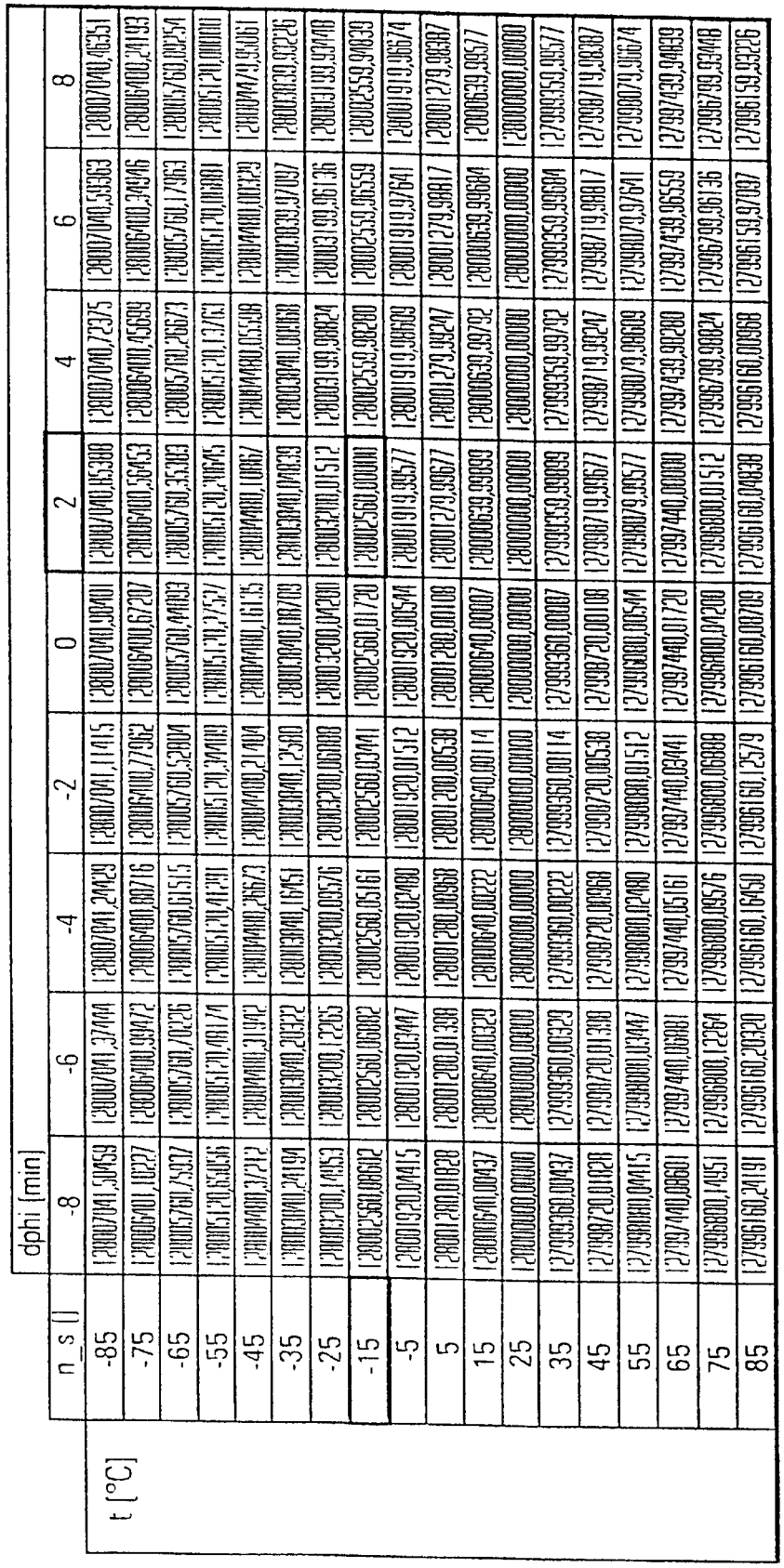
FIG. 12 shows the contents of the memory MEM in FIG. 7.
Figure 13A:
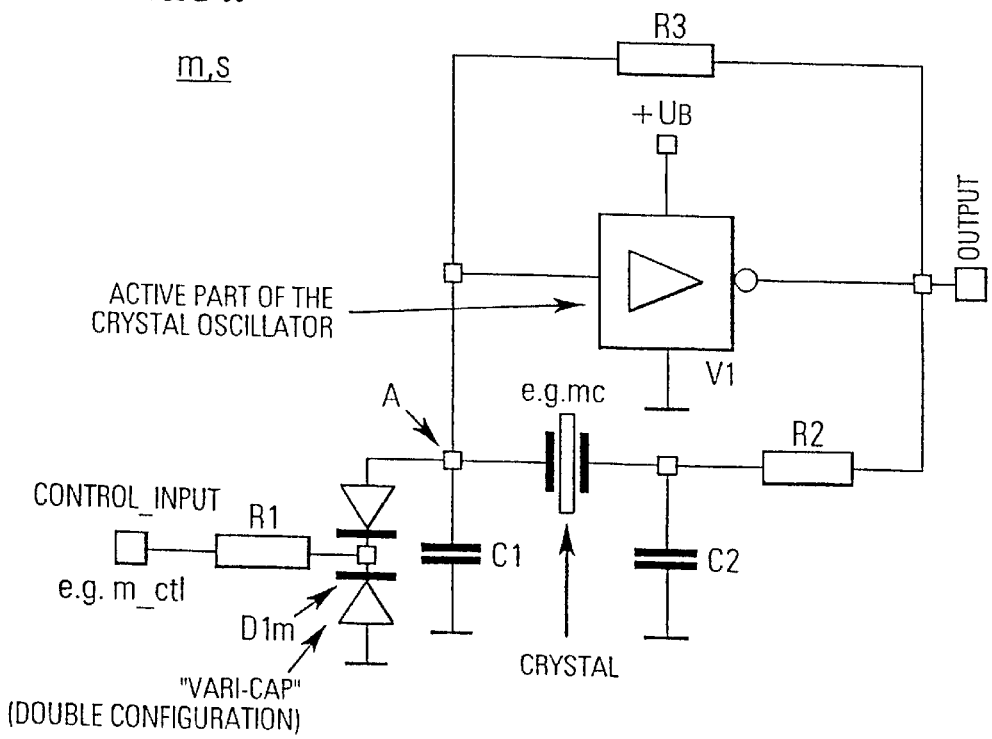
FIG. 13a shows a block diagram of a master oscillator.

FIG. 8 shows an embodiment of the frequency ratio determining means FRDM shown in FIG. 7, FIGS. 9a, 9b show a flow chart of the method according to the first embodiment, FIG. 10 and FIG. 11 show the temperature characteristics and a table (similar to FIG. 4), respectively, for the two temperature characteristics with one of them being detuned, and FIG. 12 shows the aforementioned table of precalculated values of n__s for various combinations of cut-angles and temperatures. FIG. 13 and FIG. 14 show different examples of the first (master) and second (slave) crystal oscillator including additional detuning circuitry for detuning the temperature characteristic with respect to the temperature characteristic of the first (master) crystal oscillator.

In FIG. 7 the master (first) crystal oscillator m includes a master crystal mc which is cut under an angle and which has a master resonant frequency temperature characteristic. The master crystal oscillator m is adapted to output a master oscillation frequency f__m with a master oscillation frequency temperature characteristic df__m/fc__m assumed to be mainly determined by the master crystal resonant frequency temperature characteristic. Therefore, the master crystal oscillator m has not been changed with respect to the oscillator m in FIG. 5 and therefore, the frequency temperature characteristic of the master crystal oscillator output signal f__m still corresponds to aforementioned master oscillation frequency temperature characteristic.

$$df\_m/fc\_m = a1(T-Tinv) + a3(T-Tinv)^3 \qquad (2)$$

Furthermore, the master crystal oscillator m comprises a master (first) tuning means MTM for tuning the master oscillation frequency f__m n response to a master control signal m__ctl, wherein said master tuning means MTM tunes the master oscillation frequency f__m to a predetermined master center frequency fc__m when the master control signal m__ctl has a predetermined master default value. The master tuning means MTM is necessary for tuning the master oscillation frequency to a defined value, e.g. to the value mentioned in equation (3.1). If for example the ambient temperature is precisely 25° C. than of course there is no necessity to readjust the master oscillation frequency f__m to its center frequency fc__m. However, if the ambient temperature is not equal to the 25° C. (inflection temperature), then a master (first) control signal m__ctl must be applied to retune the frequency to the center frequency. It should be noted that of course the value of the master control signal can not be known beforehand since the temperature characteristic is as such not known. However, by measuring the master oscillation frequency f_m output by the master crystal oscillator m a value for the master control signal can be found at any ambient temperature for tuning the master crystal oscillator to its center frequency.

Furthermore, in FIG. 7 the slave crystal oscillator s includes a slave (second) crystals sc which is cut under the same angle as said master crystal mc and which thus has the same resonant frequency temperature characteristic as said master crystal mc. The slave crystal oscillator s outputs a slave oscillation frequency f_s with a slave oscillation frequency temperature characteristic df_s/fc_s.

The slave crystal oscillator s also comprises a slave tuning means FSTIM; SSTM for tuning the slave oscillation frequency f_s in response to a second and third control signal s1_ctl and s2_ctl.

According to the invention the slave oscillation frequency temperature characteristic df_s/fc_s is different to the master oscillation frequency temperature characteristic df_m/fc_m according to the following equation (2').

$$df\_s/fc\_s = a1(T-Tinv) + a1'(T-Tinv) + a3(T-Tinv)^3 \quad (2')$$

As shown in FIG. 10 and in FIG. 11, the additional linear term a1'(t–Tinv) makes the slave oscillation frequency temperature characteristic different to the master oscillation frequency temperature characteristic. When beginning the measurements, also the slave crystal oscillator must be tuned to its center frequency fc_s, for example to the value given in equation 3.3. Unless the ambient temperature happens to be precisely the 25° C. for which the manufacturer has defined a predetermined frequency, the second control signal s1_ctl is used for tuning the slave oscillation frequency f_s to its predetermined slave center frequency fc_s. Since the temperature characteristic is not known at the beginning of the measurements, it cannot be known beforehand to which value the second control signal must be set since this will depend on the temperature characteristic and the existing ambient temperature. However, by measuring the output frequency f_s the second control signal can be set to a value that tunes the slave crystal oscillator to its center frequency.

When the third control signal s2_ctl is disabled the slave oscillation frequency temperature characteristic is identical to the master oscillation frequency temperature characteristic and when said third control signal is enabled, the slave oscillation frequency temperature characteristic is determined by equation (2').

In this description, when a control signal is being described as "disabled" this means that the respective tuning signal input is not used for performing the frequency adjustment. In practice, in order to avoid floating terminals, of course a respective terminal is set to a predefined (voltage or current) value (e.g. half the tuning voltage range) such that for example the capacity of the tuning element (if tuning is performed by changing a capacity) assumes a well defined value. On the other hand, if the signal is being described as being "enabled" this means that the signal is used for an active adjustment of the frequency.

A temperature sensor TSEN is provided for sensing the existing ambient temperature. A slave crystal oscillator setting means SSET receives a detuning DT control signal from processing means PM and a temperature T is sensed by the temperature sensor TSEN. The slave crystal oscillator setting means SSET disables/enables the third control signal s2_ctl dependent on the detuning control signal DT. In particular, the means SSET enables and sets the third control signal s2_ctl to a control value corresponding a temperature T as sensed by the temperature sensor TSEN. Thus, the second control signal s2_ctl essential controls the additional linear term a1'(T–Tinv) as shown in equation (2'). Of course, when a control signal s2_ctl corresponding to the ambient or inflection temperature of 25° C. is applied, then the linear term vanishes and the temperature characteristics of master and slave will be identical. As shown in FIG. 10, and in the table in FIG. 11, at ambient temperature of approximately 25° C. the relative deviations of frequency are identical.

As explained above, to begin the measurements with defined output values of the oscillator frequencies, a further master/slave setting means MS-SET outputs the first and second control signals m_ctl; S1_ctl for tuning the master and slave oscillators to their center frequencies when the third control signal s2_ctl is still disabled. The slave tuning means STM receiving the signals s1_ctl; s2_ctl can comprise two seperate tuning means FSTM; SSTM respectively for the center frequency tuning and the additional detuning with the additional linear term. However, it is also possible that the first and second slave tuning means FFTM; SSTM are constituted by a single unit STM which receives both control signals s1_ctl; s2_ctl.

Figure 13B:
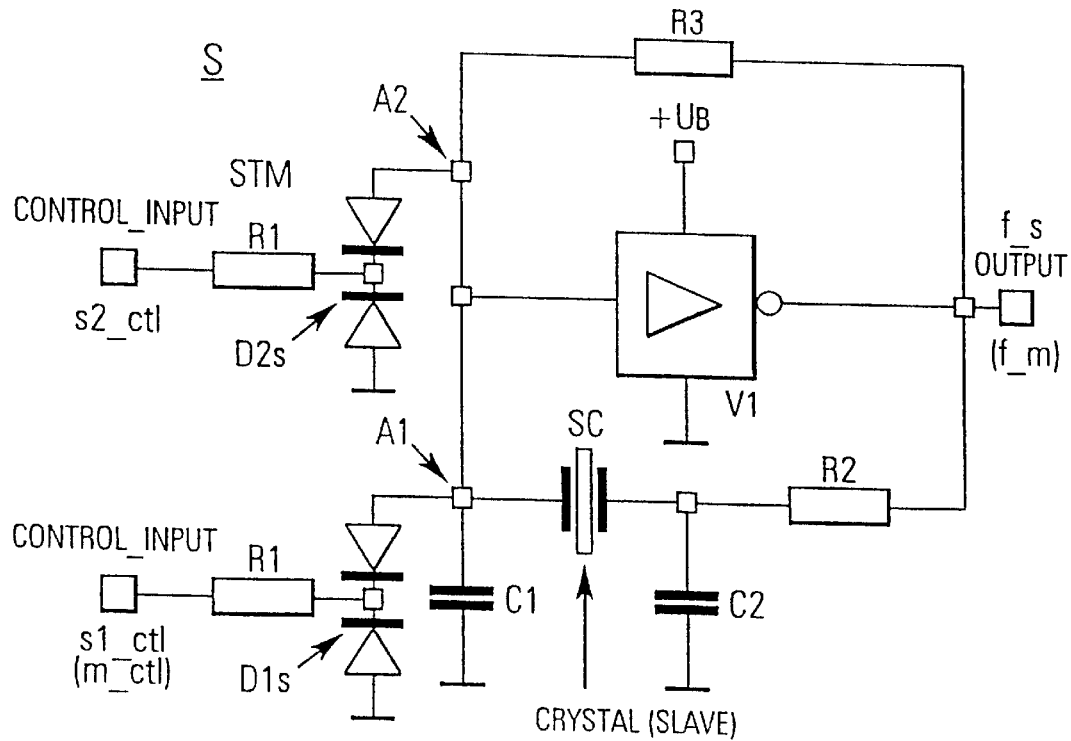
FIG. 13b shows slave oscillator including a slave tuning means STM with a first and second slave tuning unit realized by a first and second variable capacitor D1s, D2s.
Figure 14:
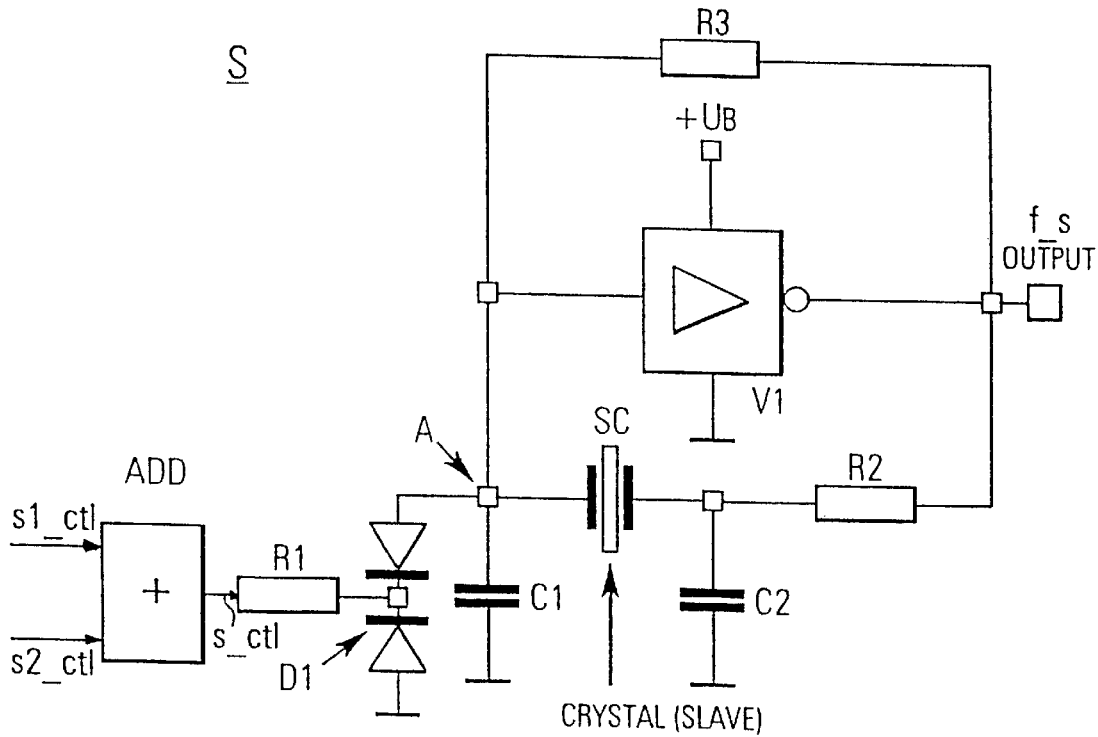
FIG. 14 shows the configuration of a slave oscillator having two control inputs for tuning the oscillator to its center frequency by using an adding circuit and only one variable capacitor.

Since the realization of the additional linear term a1' (T–Tinv) by the temperature sensor TSEN, the setting means SSET and the slave tuning means STM is an important aspect, two embodiments of the slave crystal oscillator are shown in FIG. 13b and FIG. 14. As shown in FIG. 13a, the basic circuit (used for the mater oscillator) as for example shown on page 97 of "Professionelle Schaltungstechnik" by Dieter Nuehmann, Franzis Verlag, ISBN 3-7723-4002-4, comprises a crystal sc, an active part of the crystal oscillator V1, resistors R1, R2, R3, capacitors C1, C2 and a "vari-cap" (variable capacitor whose capacitance is dependent on the input current) configuration D1s. The element R1, D1s in FIG. 13a,b and FIG. 14 are for example used for tuning the oscillation frequency to the center frequency. The master crystal oscillator m only comprises the circuit FIG. 13a with one "vari-cap" configuration D1s since the temperature characteristic of the master oscillator will not be detuned.

The element D1s is used for a purpose of tuning the resonant frequency of the respective crystal to vary the oscillator output frequency. The tuning element D1s provides a voltage (control-voltage) dependent capacitance which is pulling the resonant frequency of the crystal. The default value of the controlled-voltage is the voltage setting which is tuning the oscillator frequency exactly to the desired center frequency (at normal temperature), i.e. a compensation of initial tolerances of the crystal and the circuit. The master/slave setting means MS/SET of the processing means PM outputs a respective voltage control signal m_ctl; s1_ctl to a respective element D1 to tune the master/slave oscillators to their center frequencies.

As shown in FIG. 13b, a first possibility to realize the additional linear term is simply to provide a second control input s2_ctl and a second variable-capacitor configuration D2s. Even when no control voltage is applied to the variable capacitor D2s, this will add a further capacitance parallel to C1 and therefore the first control signal s1_ctl will have a different value in order to tune the frequency to the center frequency. Therefore, when no control voltage is applied to D2s, i.e. the second control signal S2_ctl is disabled, there can always be found a control voltage for D1s to tune the oscillator to the predetermined center frequency. Once the center frequency control voltage s1_ctl has been applied to the circuit at the beginning of the measurements, then a further control voltage is supplied to D2s in order to realize the linear term.

A linear term (temperature/frequency relationship) can be easily realized, e.g. by using an "IC temperature sensor" as for example disclosed in "IC temperature sensor provides thermo-couple code-junction compensation", national semiconductor, application note AN225, 4/79 by Michael X. Maida. The output signal of the temperature sensor (voltage output linear to the temperature) is fed to the second control input s2_ctl of the crystal oscillator. Therefore, starting with an oscillator which has been tuned to its center frequency with the first control signal s1_ctl, its frequency deviation from this center frequency will be linear with respect to the temperature variation.

Figure 15:
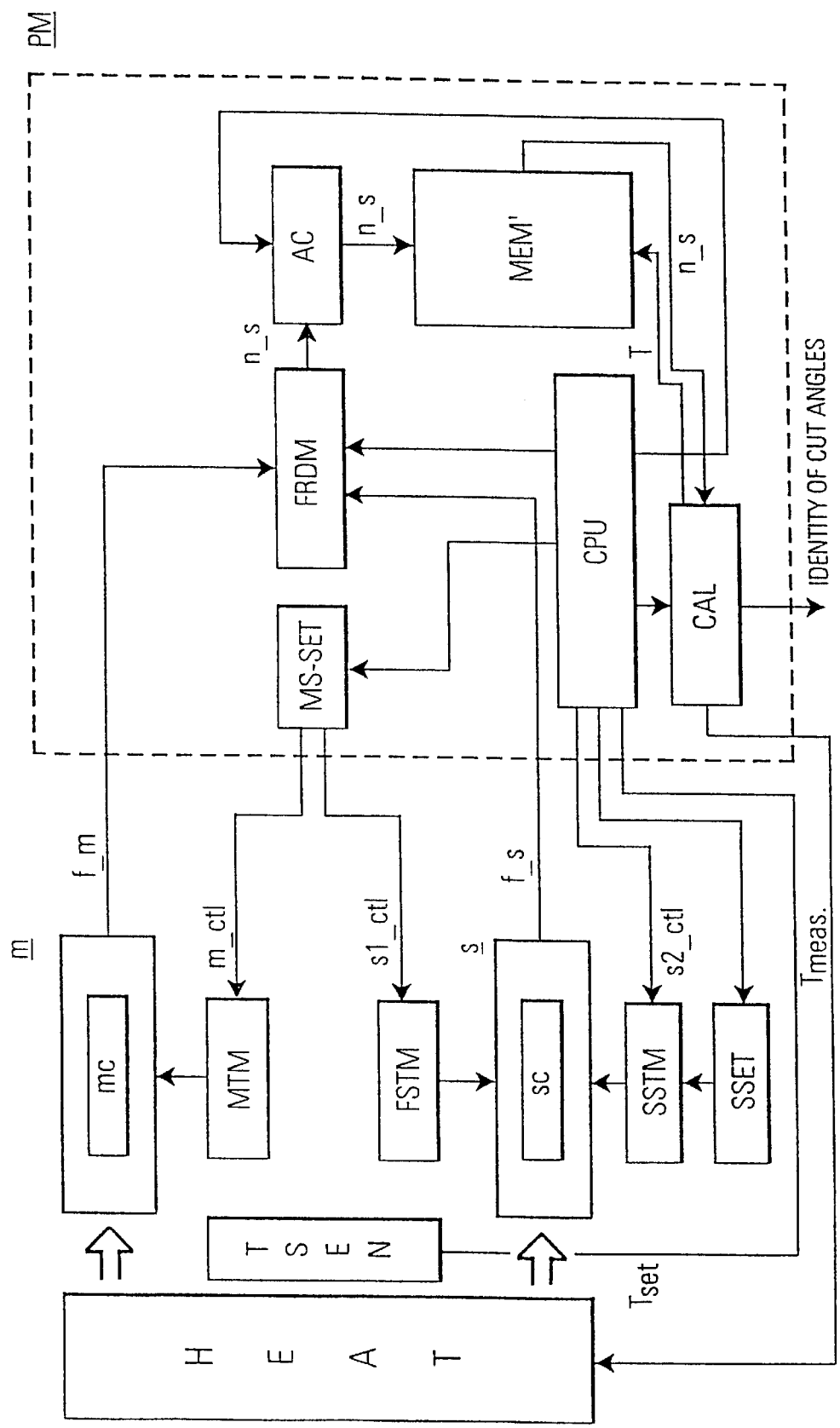
FIG. 15 shows a second embodiment of the device according to the invention for determining the identity or difference of two crystals having different cut-angles.

One other simple example of implementing a temperature dependent control signal is to make use of the temperature dependency of a pn junction with about −2 mV/K. Depending on the precision required, readily available temperature sensors with a well-defined specific temperature/output signal relationship can be employed as well. Oscillators are well-known as voltage controlled or current controlled types. FIGS. 13a, 13b and 14 show voltage controlled types, however, the units in FIG. 7 and FIG. 15 can also be adapted to current controlled types.

Of course, it should be noted that in principle there exists a non-linear voltage/capacitance relationship in the variable capacitor D2s, but under certain conditions (a small control voltage swing, additional capacitors (fixed values) for linearization etc.) an overall linear control voltage/oscillator frequency relationship can be realized for the complete oscillator. Thus, a linear control voltage versus temperature relationship results in a linear frequency shift versus a temperature relationship.

On the other hand, in principle—if the non-linear relationship is known or even a different tuning circuit is used—it is possible to also realize non-linear terms rather than the linear term shown in equation (2'). The important feature of the invention is that somehow a well defined detuning of the temperature characteristics of master and slave oscillator is achieved. Whether this is linear or cubic is not relevant for the invention, although the linear detuning is preferred.

Of course, although the temperature characteristic is still not known at the stage, at least the additional detuning is well defined before the measurements start, i.e. the degree of linear shift of the oscillator output frequency with respect to temperature can be measured, i.e. the artificial linear term is well defined (although of course the overall temperature characteristic is still not known). Of course, it will be appreciated that also a circuit in FIG. 14 can be used, where a voltage combiner network (a resistor, op-amp) is provided which combines the first and second control voltages s1_ctl, s2_ctl. The resultant control voltage s_ctl is finally applied to the single variable capacitor D1. In this case, the center frequency adjustment is first performed by disabling the second control input s2_ctl (no voltage is applied at this input) and the control voltage s1_ctl is adjusted to achieve the center frequency tuning. Then the control voltage s1_ctl is fixed and the measurements can start by setting the voltage at the second control input s2_ctl to a temperature as sensed by the temperature sensor TSEN.

It will now be understood that the slave tuning means STM n FIG. 7 can in general be constituted as in FIG. 14, i.e. the slave tuning means STM comprises the adder ADD, the resistor R1, and the element D1. Alternatively, a first and second slave tuning means FSTM, SSTM in FIG. 7 may be realized by a double configuration of R1, D1s, D2s as shown in FIG. 13b.

The method for determining the cut-angle by using the additional linear term is shown in FIG. 9a. Before the actual measurements start in step S2, the known relationship of a frequency ratio parameter n_s dependent on the temperature T and the cut-angle is stored in a memory means MEM, e.g. an EEPROM. The contents of this memory are shown in FIG. 12. The relationship can be stored as a look-up table beforehand by inputting a number of crystals with known cut-angles and by measuring the frequency ratio parameter n_s in the circuit in FIG. 5. It should be noted that it is also possible to precalculate the relationship in FIG. 12 since of course the frequency temperature dependency of an AT cut-angle is in principle known from equation (1) or (2).

After storing the relationship in FIG. 12 in the memory MEN in step S1, the following steps according to the first embodiment of the method according to the invention are carried out. In step S1 the known relationship of a frequency ratio parameter n_s dependent on the temperature T and the cut-angle as shown in FIG. 12 is stored in the memory means MEM. In step S2, in order to have defined starting conditions, the master/slave-setting means MS-SET outputs control signals m_ctl and s1_ctl to the master tuning means MTM and a first slave tuning means FSTM in order to tune the slave crystal oscillator and the master crystal oscillator to their center frequencies fc_m, fc_s as for example mentioned in equations (3.1) and (3.3).

When tuning the frequencies to the center frequencies the third control signal used for detuning the temperature characteristics (i.e. for realizing the linear term a1'(T−Tinv) is disabled, i.e. a central processing unit only gives a center control CT to the master/slave-setting means MS-SET and switches off a detuning control signal DT to the slave setting means SSET. As explained above, depending on the realization of the tuning means, for example in FIGS. 13b, 14, a control voltage can be applied to tune the frequency via the variable capacitor configuration. Such default values are those values which are tuning the oscillators to their center frequencies at normal ambient temperature. Such default values for the control signal m_ctl and the control signal s1_ctl are stored in an EEPROM. Therefore, after having carried out step S2, the master and slave oscillator operate at their center frequencies. If the circuit in FIG. 7 is operated at non-ambient preset temperatures, the outputs of the oscillators can be monitored and a corresponding control signal to tune the frequencies to the center frequencies is applied.

In step S3 the central processing unit CPU outputs the detuning control signal DT and the output voltage of the temperature sensor TSEN is fed to the slave setting means SSET and to an input of a frequency deviation determining means FDDM which will be explained below. That is, when the control signal DT is output to the SSET means, the output voltage of the temperature sensor TSEN (or possibly a voltage level converted version thereof) is fed as the control signal (voltage) s2_ctl to the slave tuning means STM, for example to the second slave tuning means SSTM if the slave tuning means STM is realized by two different units FSTM, SSTM. As explained above with reference to equation (2') such a setting of the slave tuning means STM will detune the resonant frequency temperature characteristics of the master oscillator with respect to the slave oscillator (see FIG. 10).

In step S4 a frequency ratio determining means FRDM measures the output frequencies f_m and f_s and determines the frequency ratio parameter n_s representing the ratio of the slave oscillator frequency f_s to the master oscillator frequency f_m. Since the master oscillator has not undergone a detuning, of course the output frequency of the master oscillator f_m will still be its center frequency fc_m. Essentially, the frequency ratio parameter n_s can be described with equation (4.5) as explained above.

In step S5 the frequency ratio parameter n_s is output to an access means AC which is controlled by the central control unit CPU by an access control signal ACC. The access means AC accesses in the memory MEM the known relationship of the frequency ratio parameter n_s dependent on the temperature t and the cut-angle as shown in FIG. 12. Furthermore, the temperature T is used in the read-out process in step S5. As explained above, in FIG. 12 a known relationship is stored which has been for example measured for a number of different crystals having different (known) cut-angles when being used in the circuit in FIG. 7. That is, the table in FIG. 12 corresponds to measurements having been carried out respectively with a detuning of the slave temperature characteristic depending on a specific temperature. When accessing the table or the known relationship in the memory MEM, a closest match of the determined frequency ratio parameter n_s with a value in the table is determined at the respective temperature T as sensed by the temperature sensor. For example, if the temperature as identified by the temperature sensor TSEN indicates +15° C. and the frequency ratio parameter n_s is 128002560,0001 then the (framed) value of 128002560,00000 is the entry having the closest match and therefore the cut-angle dphi is determined to be 2. The specific values listed in FIG. 12 have been recorded for the example values as stated in equations (3.1), (3.3), (3.6), (3.7), (3.8), (2), (2'), (4.1) together with the following set of parameters:

$$n\_m\ [\ ]=130000000\ \text{max\_counter\_state\_m} \quad (3.2')$$

$$dphi\_m\ [\text{min}]=\text{difference between cut angle and zero angle (master and slave crystal)} \quad (3.4')$$

$$a1\ [1/°\ C.]=-0.084*dphi\ \text{linear coefficient;} \quad (3.5')$$

$$a1'\ [1/°\ C.]=-0.5\ \text{add. linear temperature coefficient for slave crystal} \quad (3.9)$$

$$T\ [°\ C.]=\text{ambient temperature;} \quad (3.10)$$

Thus, it can be seen that the introduction of an additional linear temperature coefficient is leading to a unique frequency ratio parameter n_s for each individual cut-angle and temperature as shown in FIG. 12. Based on a unique n_s, the cut-angle can be determined from FIG. 12. Thus, after step S5 the temperature characteristic is basically known since the cut-angle is known.

In the memory MEM' a relationship of the temperature dependent resonant frequency characteristic (see FIG. 2) of the crystals dependent on the temperature and the cut-angle is stored. The frequency deviation determining means FDDM then accesses this relationship (e.g. stored as a look-up table according to FIG. 2) in the memory MEM' with the determined cut-angle dphi and a temperature T. For example, when the temperature corresponds to 15° C. and the cut-angle has been determined to be 4, then a value of 5.8800 ppm is read out. If the master and slave tuning means MTM, STM use a detuning via a variable capacitor which e.g. tunes the frequencies with 1 ppm/volt, then a voltage of 5.8800 volts would have to be applied to the tuning means in order to readjust the frequencies. Thus, an accurate temperature compensation can be carried out if the ambient temperature deviates from the inflection point temperature. That is, when the ambient temperature deviates from the inflection point temperature, then the nominal default values for the control signals m_ctl and s1_ctl do not really tune the master and slave oscillator to their center frequencies, because this is only so when the ambient temperature is identical to the inflection point temperature. Only the values finally read out from the relationship shown in FIG. 2 will give an exact value of the tuning voltage which must actually be applied for a temperature compensation to the oscillators when the ambient temperature is not the inflection point temperature.

It should be noted that of course as soon as the cut-angle has been determined the temperature characteristic according to equation (2) is known and therefore the table in FIG. 2 is only one example of using a look-up table how the corresponding frequency deviation and hence a suitable tuning voltage can be found. In principle, a temperature compensation voltage can always be found once the cut-angle has been determined according to steps S1–S5 in FIG. 9a.

Once the cut-angle of both crystals is found, the appropriate control voltages are calculated by the processor unit and applied to the oscillator inputs m_ctl and s1_ctl in order to tune the oscillators back to their center frequencies. The system can now change from the "calculation mode" of operation in FIG. 9a to a so-called "normal-mode" of operation where the third control signal s2_ctl is switched off, i.e. the control signal DT is switched off and the oscillators operate at their center frequencies as desired. Values for the temperature and temperature compensated control voltages are stored in the memory MEM' and are collected for the temperature range of interest. Since no external equipment is needed, the calculation-mode of operation can be performed during a temperature cycle at the manufacturer site or at any other time even once the equipment is out in the field.

As shown in FIG. 12, in principle one value is sufficient to determine the cut-angle. However, to improve the accuracy of the determination, the cut-angle can be determined for a number of different temperatures. That is, if intentionally the temperature is increased or decreased (the oscillators are heated or cooled or a change in the ambient temperature takes place in which case no active heating or cooling by a temperature application means, e.g. a heater or cooler, is necessary), then more frequency ratio parameters for different temperatures are available so that the calculation of the cut-angle with reference to FIG. 12 can be made more accurate. Once the whole temperature range is described by a sufficient number of steps i.e. dphi is determined with sufficient accuracy, the crystals can be temperature compensated by using the values stored in the memory MEM' or by using the value of dphi rather than repeating the calculation-mode of operation.

Furthermore, it should be noted that it is also possible to provide a plurality of slave oscillators each having a different nominal center frequency, however, each using a crystal from the same batch, i.e. having the same cut-angle. Then several tables as in FIG. 12 will be used and several frequency ratio parameters will be determined. By averaging the cut-angles which have been determined on the basis of the several frequency ratio parameters, a more accurate cut-angle determination can be performed.

Hereinafter, an embodiment of the frequency ratio determining means FRDM shown in FIG. 7 is described with reference to FIGS. 8 and 9b. The frequency ratio determining means FRDM comprises a master counter mct for counting the master oscillator frequency pulses of the master oscillator frequency f_m, a slave counter sct for counting the slave oscillator frequency pulses of the slave oscillator frequency f_s in step S41 and a maximum comparison means MAX-CPM for comparing the master counter count value n_m with a determined maximum value n_mmax in Step S42. The processing means PM further comprises a reset/readout-means RST-ROUT adapted to read out the master counter count value n_s as said frequency ratio parameter n_s when said maximum comparison means CMT detects that the master counter count value has reached said maximum value n_mmax in step S51 and for resetting the master and the slave counter mct, sct in such a condition. In this case, as shown in FIG. 8, the access means AC uses the counter value n_s as the frequency ratio determining parameter for accessing the memory MEM in step S52.

As illustrated in equation (4.5) and as described with reference to FIG. 5, the counter value n_s is a measure of the frequency ratio of the slave to the master frequency. Therefore, whenever the value n_m output by the master counter mct and representing the number of pulses reaches the maximum n_mmax, the reset/readout means RST-ROUT outputs the reset signals RST-S, RST-M to the slave counter sct and the master counter MCT. The aforementioned procedure is illustrated with steps S41, S42, S51, S52 in FIG. 9b.

It is very obvious from FIG. 12, that the resolution to which dphi is determined depends on the value of n_m in order to give sufficient different values of n_s for a frequency ratio determining means FRDM as realized in FIG. 8. In radio systems, where phase locked loops are used to generate the RF signals, these signals may be used to feed the master and slave counter. Since the RF frequency is derived from the reference frequency (master crystal/slave crystal) the relationship of equation (4.5) is still valid. Therefore, n_m can be increased without increasing the time needed to perform the calculation-mode of operation (e.g. GSM system, transmitter frequency: 897 MHz=69×13 MHz). Of course, the advantage of the faster calculation-mode of operation has to be weighted versus increased circuit complexity and current consumption.

Furthermore, measuring the time between the last increment of the slave counter and the end of the gate period (=fraction of one slave cycle) can be used to increase the resolution even further. A capacitor which is charged proportional to the fraction of one slave clock cycle can be used for this purpose. The capacitor voltage is AD-converted and represents the time between the last slave counter increment and the end of the gate period.

SECOND EMBODIMENT

As explained above in the first embodiment, an additional linear temperature coefficient is added to the temperature characteristic of the slave crystal (oscillator) in order to detune the frequency characteristics of the slave crystal oscillator. It will be appreciated that this is essentially equivalent to a situation where two different crystals with different cut-angles are used in the slave and master oscillator. That is, if no detuning is applied to the temperature characteristic, the frequency ratio parameters can be used in order to evaluate how identical (or different) the cut-angles of two crystals used in the master and slave oscillators are. The second embodiment of the invention is described with reference to FIGS. 15, 16a, 16b relates to this aspect and this mode of operation will hereinafter be called the "calibration-mode" of operation.

When no active additional linear term or additional detuning is applied to the second oscillator the principle depen dency of the frequency characteristics on the temperature are represented by the following two equations:

$$df\_m/fc\_m = a1\_m(T-Tinv) + a3(T-Tinv)\hat{\ }3 \quad (5.1)$$

$$df\_s/fc\_s = a1\_s(T-Tinv) + a3(T-Tinv)\hat{\ }3 \quad (5.2).$$

These equations correspond to equation (2) where no additional detuning has been applied. Furthermore, equation (4.1) to equation (4.5) are equally well applicable to the second embodiment, i.e. a frequency ratio parameter n_s is calculated as the ratio of T_m/Tc_s representing the frequency ratio of the master oscillation frequency to the slave oscillation frequency. Using equation (5.1), (5.2) a general relationship for the frequency ratio parameter n_s when no additional linear term has been applied can be calculated as shown in the following equation (6).

$$n\_s = (n\_m/(fc\_m^*(1+(a1\_m(T-Tinv)+a3(T-Tinv)\hat{\ }3^*1e6))^* \\ \{(fc\_s^*(1+(a1\_s(T-Tinv)+a3(T-Tinv)\hat{\ }3)^*1e6)\} \quad (6)$$

Figure 16A:
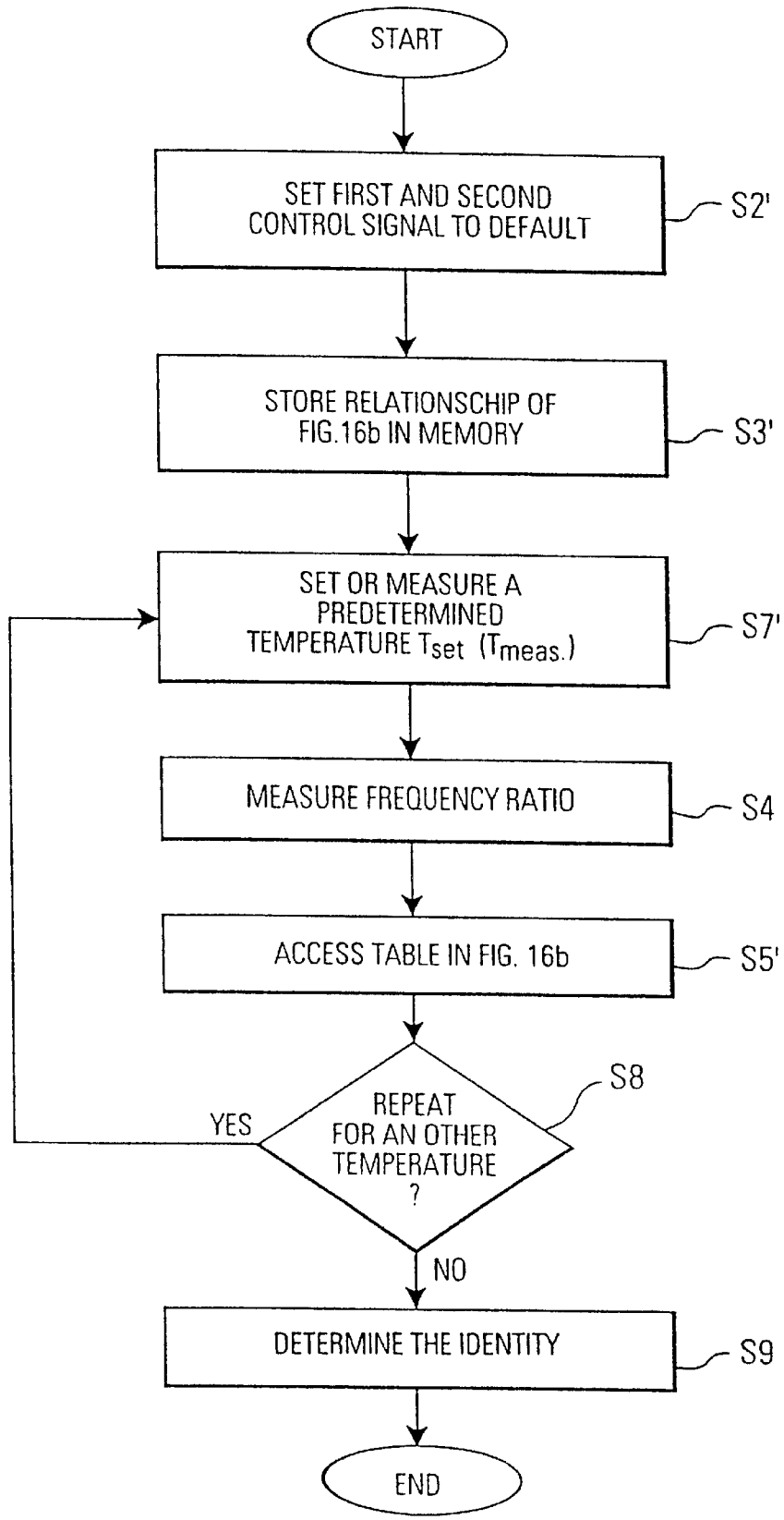
FIG. 16a shows a flow chart for determining the identity or difference of cut-angle according to the embodiment in FIG. 15.

In equation (5.1) and (5.2) the two frequency characteristics are different because of the difference in the linear term a1_m and a1_s resulting from the two different cut-angles because these two parameters depend on the cut-angle of the master and the slave oscillator crystal, respectively. Therefore equation (6) shows a relationship of the frequency ratio parameter n_s on the cut-angle of the master crystal and the cut-angle of slave oscillator crystal. Such a relationship of the frequency ratio parameter n_s dependent on the cut-angles of the two crystals can be recorded (precalculated or stored as a table) in the memory MEM' shown in FIG. 15. (See also step S3' in FIG. 16a). The stored relationship is shown as a look-up table for the following values in FIG. 16b. In FIG. 16b the master crystal resonant frequency is given by equation (3.1). Furthermore equation (3.2') is used for the maximum counterstate n_m. Furthermore, the slave crystal oscillator frequency is given by equation (3.3). The linear coefficients a1_m and a1_s of the master and the slave oscillator are respectively given by equation (3.5'). The cubic coefficients a3_m and a3_s are respectively given by equation (3.6). The inflection temperature is 25° C. as given by equation (3.5). The temperature T for which equation (6) has been evaluated in FIG. 16b is T=45° C.

The procedure to determine the "identities of cut-angles" is shown in FIG. 16a. In step S2' the first and second control signals are set to their default values, i.e. to the default values which tune the respective oscillators to their center frequencies at the reference temperature. In step S3' the predetermined relationship as reflected by equation (6) or the table in FIG. 16b is stored in the memory MEM. In step S7 a temperature sensor TSEN measures the ambient temperature or a predetermined measurement temperature is actively supplied to the first and second oscillators m, s by a temperature_application means HEAT. The measurement temperature can be above or below the reference temperature, i.e. the temperature application means HEAT can heat or cool the first and second oscillators m,s.

In connection with step S7 it should be noted that only as a preferred embodiment the temperature application means HEAT is used because if the current ambient temperature is different to the inflection point temperature also a measurement of the frequency ratio parameter can be carried out at the ambient temperature.

In step S4 the frequency ratio parameter n_s representing the frequency ratio of said oscillation frequency f_s to said first oscillation frequency f_m is determined as the measurement temperature which is—as explained above—different to the inflection point temperature of the crystal. As an example the ambient temperature T has been measured to be 45° C. which is of course different to the inflection point temperature of 25° C. according to equation (3.7). As an example the frequency ratio parameter for the above given values has been measured to be n_s=127997849,61626.

In step S5' this value of n_s is used to access the relationship in equation (6), i.e. to access for example the look-up table in FIG. 16b which has been prepared on the basis of equation (6). As explained above, the respective cut-angle of the master and the slave crystal will directly influence the parameters a1_m and a1_s and therefore this relationship can be prerecorded in memory MEM'. When the table is accessed with this value a closest match between the prerecorded values for n_s and the measured frequency ratio parameter is searched. A close match has been found with the value at dphi_s=6.0 1/° C. for the slave crystal and dphi_m=4.0 1/° C. Thus, the cut-angles of the first and second crystals corresponding to the measured frequency ratio parameter n_s have been read out in step S5'.

In step S9 the identity of the cut-angles can be calculated by determining the difference of the determined cut-angles or the ratio of the determined cut-angles.

In the above procedure of steps S2', S3', S7, S4, S5' and S9 it is important that the ambient temperature at which the measurement is carried out must not be equal to the temperature of the inflection point since the frequency ratio parameter remains constant at this temperature for any combination of cut-angles. Therefore, if in step S7 the ambient temperature happens to be equal to the inflection point temperature the result in S5 is meaningless and therefore in step S8 a further measurement is carried out by setting a new measurement temperature in step S7 ("Y" in step S8). As explained before, one possibility is that actively a new temperature is set by the temperature applications means HEAT and a second possibility is that one merely waits until the ambient temperature as measured by the temperature sensor means TSEN assumes a different value.

In the above procedure it should be noted that all descriptions for determining the frequency ratio parameter which have been made with respect to the first embodiment (FIGS. 7, 8) equally well apply to the second embodiment.

As explained above, according to the second embodiment it is only necessary to perform one temperature measurement at a temperature which is different to the inflection point temperature and it is only necessary to determine one frequency ratio parameter at this different measurement temperature. However, of course it is also possible to repeat the measurement at several measurement temperatures different from the ambient temperature and then to average the frequency ratio parameters obtained at each measurement to increase the accuracy. The equation (6) or the look-up table in FIG. 16b is then accessed with the averaged frequency ratio parameter.

As explained above, if the two crystals have different cut-angles—which can be determined as described above—the temperature dependent frequency characteristics of both crystals are different. Using the second embodiment also a temperature compensation can be carried out as follows.

As shown in FIG. 16a and as explained above, the loop from steps S7, S4, S5', S8 back to step S7 must be used in case that the ambient temperature happens to be equal to the inflection point temperature of the crystals. However, the loop can also be used to determine a first frequency ratio parameter at a first temperature which may be equal to the ambient temperature or even the inflection point temperature. The determined frequency ratio parameter n_s($T_1$) where $T_1$ is the first measurement temperature is memorized. Then the frequency ratio measurement is repeated and a second temperature $T_2$ which is different from the first temperature $T_1$ can be reached due to environmental changes or can be actively set by the temperature application means HEAT. This second frequency ratio parameter n_s ($T_2$) can also be memorized in the memory MEM'. In order to make the two frequency characteristics identical a control voltage can be applied to the master oscillator or the slave oscillator to tune the frequency until the frequency ratio parameter measured at the second temperature $T_2$ is identical to the frequency ratio parameter measured at the first (ambient or inflection point) temperature. By repeating the frequency ratio parameter measurement at a plurality of second temperatures $T_2$ it is possible to obtain a control value for each temperature $T_2$ which makes the frequency characteristics identical.

Figure 18:
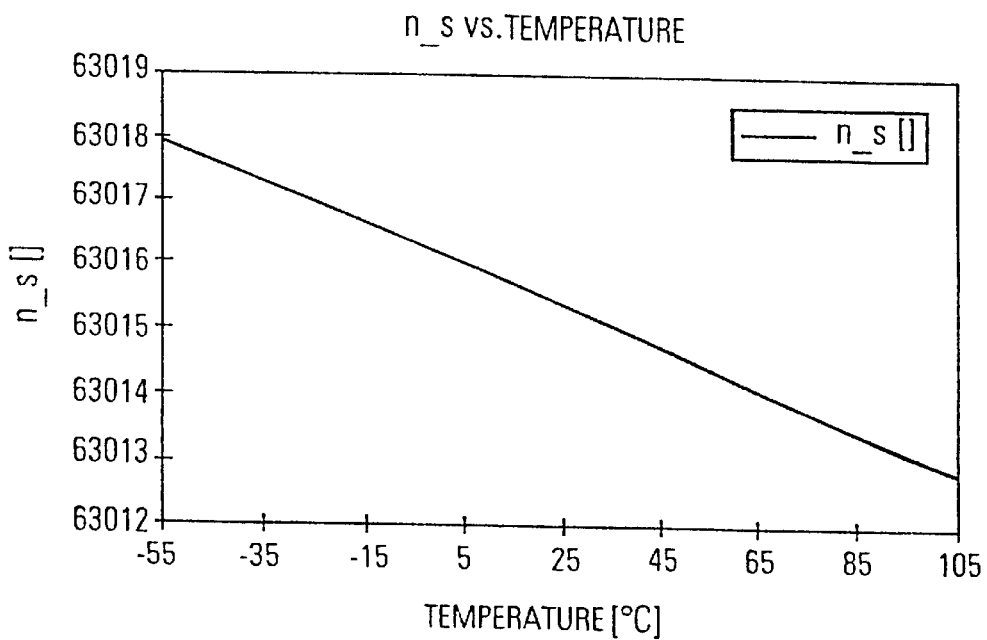
FIG. 18 shows the change of the frequency ratio parameter n_s over temperature.

Thus, for each different set temperature the frequency ratio parameter n_s is determined by the frequency ratio determining means FRDM, for example as shown in FIG. 9b. As shown with the loop in step S8 in FIG. 16a, the frequency ratio measurements are carried out for a number of different temperature values applied in step S7. As shown in FIG. 18, the frequency ratio parameter n_s is no longer constant over temperature. This means that each individual frequency ratio parameter can be related to a unique resonant frequency and temperature.

As a first example case, it may be assumed that the two used crystals indeed have different cut angles (i.e. they are from two different batches) but that their temperature characteristics—due to the cut angle difference—only differ in a linear term. This is equivalent to the case in the first embodiment, only that in the second embodiment the linear deviation term is not due to the active detuning with a detuning means but is due to the deviation in cut angle between the two crystals. In this case the cut angles and the difference can be obtained as explained above. If the cut-angles are known then it is of course easy to apply a control_voltage to one or both of the two oscillators since the temperature characteristics are then explicitly known from equations (5.1) and (5.2).

The second example case is when it cannot be assumed that the difference in cut-angle corresponds to a linear term a1' deviation, i.e. the difference in cut-angle does not lead to two temperature characteristics which differ in a linear term. One possibility is that the calculation of FIG. 16b is done by assuming a different e.g. quadratic or cubic deviation. Then the procedure for determinig the cut angles is carried out as described above.

Another possibility—if no information on the type of deviation, linear or cubic etc is available—is that first the frequency ratio parameter n_s is measured at the center frequency setting. Then, the oscillators are exposed to the second temperature (resulting in a change of n_s) and then a control voltage (or current) is applied to one of the two oscillators to re-adjust the value of n_s to that measured at the first (ambient) temperature. As explained above, a table can be set up which gives—for each temperature value—the control value to compensate the difference of the temperature characteristics, i.e. the control value which must be applied to one of the two oscillators to make to two temperature characteristics identical. Hence, in this case, the control value compensates the deviation of the temperature characteristic due to the different cut-angles independent as to whether the type of deviation (linear, quadratic or cubic etc.) is known or not. In this case, the cut angle difference cannot be directly determined like in the first example, however, the magnitude of the tuning signal to re-adjust the frequency ratio parameter to the that measured at ambient temperature indicates the degree of the cut-angle deviation.

As explained above, the determination of the frequency ratio_parameter can be used in order to provide a control voltage (or current) which is necessary to cause the two temperature characteristics to be identical. Thus, if e.g. two oscillators with two different crystals from different batches are employed, a first pre-tuning step can be performed where a temperature dependent control voltage can be determined to make the temperature dependencies identical, according to the second embodiment.

Then, the actual determination of the cut-angle can be performed according to the first embodiment. If e.g. the second (slave) oscillator receives the tuning voltage signal to match the slave temperature characteristic to that of the master oscillator according to the second embodiment then this corresponds to a cancellation of the cut-angle difference. If then the cut-angle is determined according to the first embodiment it will be the cut-angle of the master oscillator crystal which is being determined. If alternatively, the master oscillator receives the tuning voltage according to the second embodiment, then the slave crystal cut-angle is determined.

Thus, as shown with step S9 in FIG. 16a, the identity (or difference) i.e. symmetry of the cut-angles can be determined on the basis of the differences of the determined frequency ratio parameters. As explained above in the introduction with reference to FIG. 4, if the two cut-angles were the same and no detuning is applied to the slave oscillator, then obviously the frequency ratio parameter should always be the same and independent from the applied temperature.

Figure 17C:
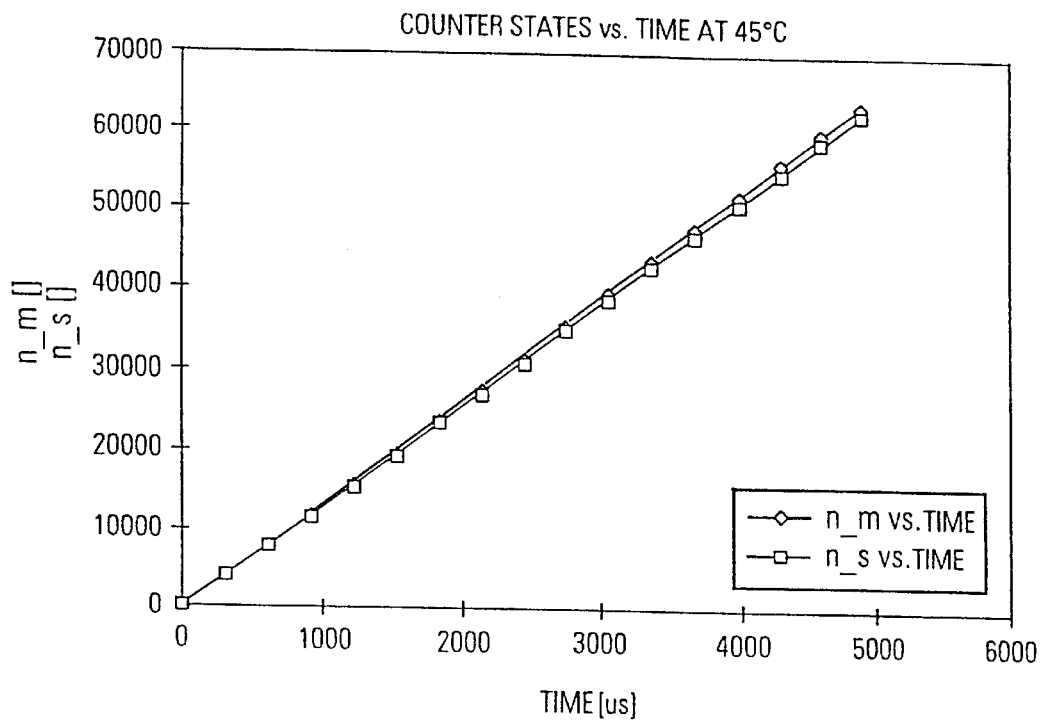
Figure 17A:
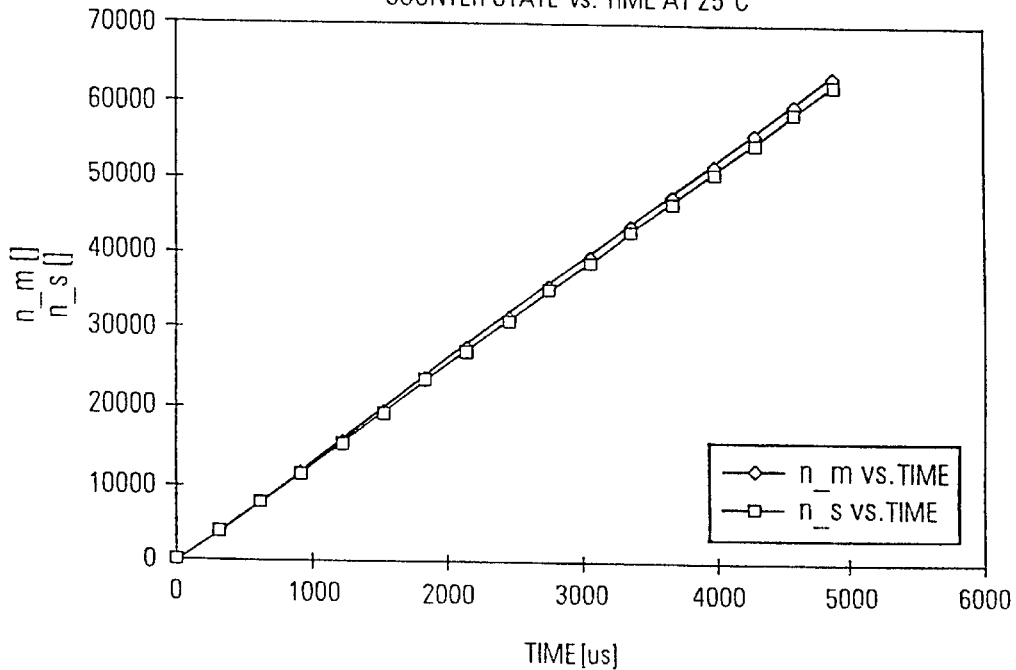
FIG. 17a shows a table of the frequency ratio parameter n_s and the master counter value n_m for two different temperatures.

FIGS. 17a, 17b, 17c show the difference or the deviation between the master counter state n_m and the frequency ratio parameter n_s (i.e. the slave counter state) in order to determine the deviation in cut-angle (according to the second embodiment) or the cut-angle (according to the first embodiment) when the frequency ratio determining means FRDM is realized as shown in FIG. 8.

As shown in FIG. 17b for the temperature of 25° C., after some time of 5000 μs there is a detectable deviation in the values n_m and n_s. FIG. 17c shows the same relationship for the temperature 45° C. The values are listed in FIG. 17a. Thus, FIG. 17 indicates that a certain time is needed such that a difference in counter values is detectable. Of course, this will also depend on the used frequency (the time needed for achieving a certain counter state obviously depends on the frequency), the actual cut-angle difference, the degree and type of deviation and the detection resolution for n_s. For example, in FIG. 17b, a time of 2000 μs is only sufficient if the parameter n_s can be resolved with a very high resolution whilst at 5000 μs a lower resolution can be used. A skilled person can derive the appropriate resolution dependent on the frequency of the oscillators and the degree and type of deviation of the two temperature characteristics (detuned with respect to each other according to the first embodiment) or the cut-angles (second embodiment).

Furthermore, it should be noted that in the above embodiment it has been assumed that the linear coefficients a1, a1 m, a1 s are constant over the temperature range which is respectively used for determining the cut-angle or the identity of the cut-angle according to the first and second embodiments. However, it should be noted that the first and second embodiment can also be used if the linear coefficient is not constant over the temperature range, i.e. when the linear coefficient has also a temperature dependency like a1=f(T). In this case it is possible to subdivide the considered temperature range into sub-temperature ranges in_which the linear coefficient is respectively assumed to be constant and to carry out the above procedures respectively in the sub-temperature ranges.

FURTHER EMBODIMENTS/ADVANTAGES

As explained above, the frequency ratio parameter determining based on equation (4.1) assumes that the resonant frequency temperature characteristic is mainly influenced by the temperature characteristics of the crystals. However, it should be noted that equation (4.1) can also be modified to take into account other components in the oscillators which additionally influence the temperature characteristic. Therefore, the invention is not restricted to the special case where the temperature characteristic is entirely only influenced by the temperature characteristic of the crystals and can be applied to the general case where the temperature characteristic is also dependent on other factors.

The temperature compensation technique can be particularly advantageously used in subscriber stations (e.g. a mobile telephone) of a telecommunication system for operation with a first and at least one second reference frequency. For example, dual mode operation stations with two frequencies for the GSM and GPS system (13 MHz/24.5525 MHz) can benefit from the temperature compensation when two different oscillators are used. Generally the subscriber station can be a multiple standard communication device, i.e. a device which is capable of operation according to more than one standard. An example is a dual or triple mode device or mobile station or a GSM mobile telephone including GPS or a GSM mobile telephone including WECT. The standards which may require the same or different crystal oscillator frequencies may include e.g. in mobile communications the GSM 999, GSM 1800 or GSM 1900 (GSM standards), AMPS, DAMPS, PDC, CWMA, WCDMA or UMTS standards and/or e.g. in positioning devices GPS, Glonass, EGNOS, WAAS or combinations thereof.

Many advantages are achieved by such temperature compensation technique. Firstly, all initial adjustments can be made at room temperature, i.e. no temperature cycling is needed which thus saves costs. All tuning can be done digitally, e.g. no laser trimmed resistor networks are necessary. The calculation/calibration-mode of operation does not need external additional equipment. The concept requires only "simple" circuit components like counters and a temperature sensor. In a mobile telephone counters can already be present by existing parts of a PLL circuit and hence these parts may be used as simple counters for the temperature compensation technique in FIG. 8. In most mobile applications temperature sensors are already employed which can be used for the detuning of the frequency characteristic. Also sufficient processing power and EEPROM slaves can be reused.

The accuracy of temperature compensation is obviously determined by the difference in cut-angles of the crystals and not the absolute values. It is much easier (and hence cheaper) to get crystals from the same slice of raw material with matched cut-angles rather than slices which are exactly cut to an absolute angle. The same is true for the remaining circuitry of the oscillator (especially tuning elements). The accuracy of difference in cut-angle can be improved by the calibration procedure which does not require additional hardware. Therefore, even if the cut-angle should not be identical, this can be first determined in the calibration mode and then this relative deviation can be used in the calculation mode for determining the absolute angles. It is more convenient to produce crystals with the same cut-angle (advantage of higher quantity) rather than manufacturing crystals with a defined difference in cut-angle.

The crystal specifications can be relaxed with respect to the frequency deviation over temperature which is also reducing costs. As explained above, in dual mode applications where two different reference frequencies are anyway required, master and slave oscillator frequencies are selected according to the standards. Instead of two separate crystal oscillators which have to be temperature compensated separately, temperature compensation for both oscillators having the crystal from the same batch is then in a single step.

Matched crystals also are delivered in one housing, i.e. lower costs for packaging. The invention can also be the basis for fully integrated reference sources since accuracy of the system is related to relative values rather than absolute values (cut-angle, active part of an oscillator). Furthermore, the estimation and hence the compensation of the temperature dependent frequency drift as described is of course not limited to AT cut crystals and can be extended to other crystal types as well.

Finally, a major advantage of the present invention is that it is not necessary to carry out an initial sweep over the whole temperature in order to be calibrated.

Whilst in the examples described above the frequency tuning has been described with specific examples relating to the usage of voltages to tune the frequencies it is noted that any other type of frequency adjustment can be used, e.g. a current control of the frequency of the oscillators. Therefore, all descriptions made above for voltage control are equally well applicable for current control.

INDUSTRIAL APPLICABILITY

Of course, the invention is not limited to any applications in telecommunications and can be used in other devices where two oscillators are used with crystals. Furthermore, although the invention has been described above with reference to the matching of two crystals, it should be understood that any other component in an oscillator can be used instead of the crystals in order to perform a similar temperature compensation technique.

Furthermore, of course the invention is not restricted to the special embodiments and teachings contained herein and the skilled person can carry out further modifications and variations on the basis of the present disclosure. Moreover, the invention is also not restricted to the described embodiments and further embodiments of the invention may comprise features which have been separately listed in the claims and in the description.

The scope of the invention is only limited by the attached claims. Reference numerals in these claims only serve illustration purposes and do not limit the scope of protection.

What is claimed is:

1. A device for temperature compensation via a determination of the cut angle of crystals used in oscillators, comprising:
   a) a first crystal oscillator
      including a first crystal, which is cut under an angle and which has a first resonant frequency temperature characteristic,
      adapted to output a first oscillation frequency with a first oscillation frequency temperature characteristic determined by said first resonant frequency temperature characteristic, and
      including a first tuning means for tuning said first oscillation frequency in response to a first control signal, said first tuning means, tuning said first oscillation frequency to a predetermined first center frequency when said first control signal has a first default value;
   b) at least one second crystal oscillator
      including a second crystal which is cut under the same angle as said first crystal and which thus has the same resonant frequency temperature characteristic as said first crystal,
      adapted to output a second oscillation frequency with a second oscillation frequency temperature characteristic, and
      including a second tuning means for tuning said second oscillation frequency in response to a second and third control signal, said second tuning means tuning said second oscillation frequency to a predetermined second center frequency when said second control signal has a second default value; and
      said second oscillation frequency temperature characteristic being identical to said first oscillation frequency temperature characteristic when said third control signal is disabled and being detuned thereto when it is enabled;
   c) a second crystal oscillator setting means for enabling and setting said third control signal to a control value dependent of a temperature;
   d) a processing means
      including a first/second control signal setting means for setting said first control signal and said second control signal to their default values;
      at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
      a memory means for storing a known relationship of the frequency ratio parameter dependent on the temperature and the cut angle; and
      an access means for accessing said memory means with said temperature and said determined frequency ratio parameter and for reading out the cut angle corresponding thereto.

2. A device according to claim 1, wherein
said second tuning means comprises a first and second tuning unit, said first tuning unit (FSTM, D1s) being controlled by said second control signal (s1_ctl) and said second tuning unit being controlled by said third control signal.

3. A device according to claim 1, wherein
said first crystal and said second crystal are taken from a same batch.

4. A device according to claim 1, wherein
said memory means is adapted to store a look-up table containing pre-calculated values representing said frequency ratio parameter of said first to said second oscillation frequency dependent on the cut angle and the temperature in accordance with the detuned second oscillation frequency temperature characteristic; wherein
said access means is adapted to access said memory means with said determined frequency ratio parameter and said temperature and to read out the cut angle corresponding to the temperature and a stored frequency ratio parameter which has a closest match to said determined frequency ratio parameter.

5. A device according to claim 1, wherein
said frequency ratio determining means comprises
a first counter for counting pulses of the first oscillation frequency of the first crystal oscillator,
at least a second counter for counting pulses of the second oscillation frequency of the second crystal oscillator, and
a maximum comparison means for comparing the first counter count value with a predetermined maximum value,
wherein said processing means further comprises a reset/readout means adapted to read out the second counter count value as said frequency ratio parameter when said maximum comparison means detects that said first counter count value has reached said maximum value and for resetting said first and said second counter,
wherein said access means accesses said memory means with said temperature value and said read out second counter count value.

6. A device according to claim 1, wherein
said memory means is further adapted to store a relationship of the temperature dependent resonant frequency characteristic of the crystals dependent on the temperature and the cut angle,
wherein said processing means further comprises a frequency deviation determining means adapted to read out from said memory means a frequency deviation dependent on said determined cut angle and an ambient temperature value measured by a temperature sensor;
wherein said second crystal oscillator setting means is adapted to disable said third control signal and said first/second control signal setting means is adapted to set said first control signal and said second control signal to a value corresponding to said read out frequency deviation to tune said first and said second crystal oscillator (m, s) back to their center frequencies.

7. A device according to claim 2, wherein
said first tuning unit comprises a voltage tunable capacitor, wherein said first control signal is a voltage signal having a predetermined voltage level.

8. A device according to claim 2, wherein
each of said first and second tuning units comprises a voltage tunable capacitor, wherein said second and third control signals are voltage signals having predetermined voltage levels.

9. A device according to claim 1, wherein
said second tuning means is formed by a single voltage tunable capacitor, wherein said second and third control signals are voltage signals, and by a voltage combiner network combining the second and third control voltage to form a single control voltage for said single voltage tunable capacitor.

10. A device according to claim 1, further comprising
a plurality of second crystal oscillators, a plurality of frequency ratio determining means and an averaging means for averaging said plurality of determined frequency ratio parameters, wherein said access means accesses said memory means with an averaged frequency ratio parameter.

11. A device for determining the identity of the cut angle of crystals used in oscillators, comprising:

a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;

b) a second crystal oscillator
including a second crystal which is cut under an angle and which has a resonant frequency temperature characteristic;
adapted to output a second oscillation frequency with a second oscillation frequency temperature characteristic; and
including a second tuning means for tuning said second oscillation frequency in response to a second control signal, said second tuning means tuning said second oscillation frequency to a predetermined second center frequency when said second control signal has a second default value;

c) said second oscillation frequency temperature characteristic being different to said first oscillation frequency temperature characteristic due to a difference in cut-angle of the first and second crystals;

d) a processing means
including a first/second control signal setting means for setting said first control signal and said second control signal to their default values;
a frequency ratio determining means for determining a frequency ratio parameter representing the frequency ratio of said second oscillation frequency to said first oscillation frequency at a measurement temperature different to the inflection point temperature of the crystals;
memory means for storing a known relationship of the frequency ratio parameter dependent on the cut-angle of the first crystal and the cut-angle of the second crystal at said measurement temperature;
an access means for accessing said memory means with said determined frequency ratio parameter and for reading out the cut angles of the first and second crystal corresponding thereto; and
a calibration means for determining the identity of the cut-angles on the basis of the read out first and second crystal cut-angles.

12. A device according to claim 11, further comprising
a temperature application means for applying said measurement temperature to each of said first and second oscillators for exposing said oscillators to said measurement temperature (e.g. t=45° C.) and/or a temperature measurement means for determining the current ambient temperature as said measurement temperature.

13. A device according to claim 11, wherein
said memory means is adapted to store a look-up table containing precalculated values representing said frequency ratio parameter of said first to said second oscillation frequency dependent on the cut angles of the first and the second crystal at said measurement temperature at said measurement temperature in accordance with the first and second oscillation frequency temperature characteristic; wherein
said access means is adapted to access said memory means with said determined frequency ratio parameter determined at said measurement temperature and to read out the first and second cut angle at a stored frequency ratio parameter which has a closest match to said determined frequency ratio parameter at said measurement temperature.

14. A device according to claim 1, wherein
said at least one frequency ratio determining means comprises
a first counter for counting pulses of the first oscillation frequency of the first crystal oscillator,
at least a second counter for counting pulses of the second oscillation frequency of the second crystal oscillator, and
a maximum comparison means for comparing the first counter count value with a predetermined maximum value,
wherein said processing means further comprises a reset/readout means adapted to read out the second counter count value as said frequency ratio parameter when said maximum comparison means detects that said first counter count value has reached said maximum value and for resetting said first and said second counter,
wherein said access means accesses said memory means with said read out second counter count value.

15. A method for temperature compensation via a determination of the cut angle of crystals used in a first and at least one second crystal oscillator having a first tuning means and a second tuning means for tuning the first and second oscillation frequencies in accordance with a first and a second and a third control signal, wherein the first oscillation frequency temperature characteristic and the second oscillation frequency temperature characteristic are identical when said third control signal is disabled and are different if said first control signal is enabled, comprising the following steps:
a) storing in a memory means a known relationship of a frequency ratio parameter dependent on the temperature and the cut-angle;
b) disabling said third control signal and tuning said first and said second oscillation frequencies to their center frequencies by setting the first and the second control signals to default values;
c) enabling said third control signal on and setting said third control signal to a control value dependent of a temperature;
d) measuring the first oscillation frequency and the second oscillation frequency and determining a frequency ratio parameter representing the ratio of the second to the first oscillation frequency;
e) accessing the memory means with said determined frequency ratio parameter and said temperature and reading out the cut angle corresponding thereto.

16. A method according to claim 15, further comprising the steps of
storing in said step a) in said memory means a look-up table containing pre-calculated values representing said frequency ratio parameter of said first to said second oscillation frequency dependent on the cut angle and the temperature in accordance with the detuned second oscillation frequency temperature characteristic; and
accessing in said step e) said memory means with said determined frequency ratio parameter and said temperature and reading out the cut angle corresponding to the temperature value and a stored frequency ratio parameter which has a closest match to said determined frequency ratio parameter.

17. A method according to claim 15, wherein
said step d) comprises the following steps to determine the frequency ratio parameter;
counting pulses of the first oscillation frequency of the first crystal oscillator by a first counter;
counting pulses of the second oscillation frequency of the at least one second crystal oscillator by a second counter, and
comparing by a maximum comparison means the first counter count value with a predetermined maximum value,
reading out the second counter count value as said frequency ratio parameter when said maximum comparison means detects that said first counter count value has reached said maximum value and resetting said first and said second counter, and
accessing said memory means with said temperature and said read out second counter count value.

18. A method according to claim 15, further comprising the steps of
storing in said step a) a relationship of the temperature dependent resonant frequency characteristic of the crystals dependent on temperature and the cut angle, and
after said step e), reading out from said memory means a frequency deviation dependent on said determined cut angle and an ambient temperature value measured by a temperature sensor;
disabling said third control signal and setting said first control signal and said second control signal to a value corresponding to said read out frequency deviation to tune said first and said second crystal oscillator back to their center frequencies.

19. A method for determining the identity of the cut angle of crystals used in a first and a second crystal oscillator having a first tuning means and a second tuning means for tuning the first and second oscillation frequencies in accordance with a first and a second control signal, comprising the following steps:
a) setting said first control signal and said second control signal to default values for tuning the first and second oscillation frequencies to their center frequencies;
b) storing a known relationship of the frequency ratio parameter dependent on the cut-angle of the first crystal and the cut-angle of the second crystal at said measurement temperature in a memory means;
c) measuring the first oscillation frequency and the second oscillation frequency and determining a frequency ratio parameter representing the ratio of the second to the first oscillation frequency at a measurement temperature different to an inflection point temperature of the crystals;
d) accessing said memory means with said determined frequency ratio parameter and reading out the cut angles of the first and second crystal corresponding thereto; and
e) determining the identity of the cut-angles on the basis of the read out first and second crystal cut-angles.

20. A method according to claim 19, wherein
the measurement temperature is the temperature measured ambient temperature or is the temperature set at said oscillators by means of a temperature application means.

21. A method according to claim 19, wherein
said identity of said cut angles is determined by calculating the difference of said determined cut-angles.

22. A method according to claim 19, wherein
said identity of said cut angles is determined by calculating the ratio of said determined cut-angles.

23. A device according to claim 1 employed in a subscriber station of a telecommunication system for operation with a first and at least one second frequency, wherein said first crystal oscillator and said at least one second crystal oscillator provide said first and said at least one second frequencies.

24. A device according to claim 23, wherein
said subscriber station is a multiple standard communication device.

25. A device according to claim 24, wherein
said multiple standard communication device is a dual mode or triple mode mobile telephone, a GSM mobile telephone including GPS or a GSM mobile telephone including DECT.

26. A device for temperature compensation via a determination of the cut angle of crystals used in oscillators, comprising:
a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) at least one second crystal oscillator
including a second crystal which is cut under the same angle as said first crystal and which thus has the same resonant frequency temperature characteristic as said first crystal,
adapted to output a second oscillation frequency with a second oscillation frequency temperature characteristic, and
including a second tuning means for tuning said second oscillation frequency in response to a second and third control signal, said second tuning means tuning said second oscillation frequency to a predetermined second center frequency when said second control signal has a second default value; and
said second oscillation frequency temperature characteristic being identical to said first oscillation frequency temperature characteristic when said third control signal is disabled and being detuned thereto when it is enabled;
c) a second crystal oscillator setting means for enabling and setting said third control signal to a control value dependent of a temperature;
d) a processing means
including a first/second control signal setting means for setting said first control signal and said second control signal to their default values;
at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
a memory means for storing a known relationship of the frequency ratio parameter dependent on the temperature and the cut angle; and
an access means for accessing said memory means with said temperature and said determined frequency ratio parameter and for reading out the cut angle corresponding thereto; and
e) wherein said memory means is adapted to store a look-up table containing pre-calculated values representing said frequency ratio parameter of said first to said second oscillation frequency dependent on the cut angle and the temperature in accordance with the detuned second oscillation frequency temperature characteristic; and
said access means is adapted to access said memory means with said determined frequency ratio parameter and said temperature and to read out the cut angle corresponding to the temperature and a stored frequency ratio parameter which has a closest match to said determined frequency ratio parameter.

27. A device for temperature compensation via a determination of the cut angle of crystals used in oscillators, comprising:
a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) at least one second crystal oscillator
including a second crystal which is cut under the same angle as said first crystal and which thus has the same resonant frequency temperature characteristic as said first crystal,
adapted to output a second oscillation frequency with a second oscillation frequency temperature characteristic, and
including a second tuning means for tuning said second oscillation frequency in response to a second and third control signal, said second tuning means tuning said second oscillation frequency to a predetermined second center frequency when said second control signal has a second default value; and
said second oscillation frequency temperature characteristic being identical to said first oscillation frequency temperature characteristic when said third control signal is disabled and being detuned thereto when it is enabled;
c) a second crystal oscillator setting means for enabling and setting said third control signal to a control value dependent of a temperature;
d) a processing means
including a first/second control signal setting means for setting said first control signal and said second control signal to their default values;

at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
a memory means for storing a known relationship of the frequency ratio parameter dependent on the temperature and the cut angle; and
an access means for accessing said memory means with said temperature and said determined frequency ratio parameter and for reading out the cut angle corresponding thereto; and
e) wherein said frequency ratio determining means comprises
a first counter for counting pulses of the first oscillation frequency of the first crystal oscillator,
at least a second counter for counting pulses of the second oscillation frequency of the second crystal oscillator, and
a maximum comparison means for comparing the first counter count value with a predetermined maximum value,
wherein said processing means further comprises a reset/readout means adapted to read out the second counter count value as said frequency ratio parameter when said maximum comparison means detects that said first counter count value has reached said maximum value and for resetting said first and said second counter,
wherein said access means accesses said memory means with said temperature value and said read out second counter count value.

28. A device for temperature compensation via a determination of the cut angle of crystals used in oscillators, comprising:
a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) at least one second crystal oscillator
including a second crystal which is cut under the same angle as said first crystal and which thus has the same resonant frequency temperature characteristic as said first crystal,
adapted to output a second oscillation frequency with a second oscillation frequency temperature characteristic, and
including a second tuning means for tuning said second oscillation frequency in response to a second and third control signal, said second tuning means tuning said second oscillation frequency to a predetermined second center frequency when said second control signal has a second default value; and
said second oscillation frequency temperature characteristic being identical to said first oscillation frequency temperature characteristic when said third control signal is disabled and being detuned thereto when it is enabled;
c) a second crystal oscillator setting means for enabling and setting said third control signal to a control value dependent of a temperature;
d) a processing means
including a first/second control signal setting means for setting said first control signal and said second control signal to their default values;
at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
a memory means for storing a known relationship of the frequency ratio parameter dependent on the temperature and the cut angle; and
an access means for accessing said memory means with said temperature and said determined frequency ratio parameter and for reading out the cut angle corresponding thereto; and
e) wherein said memory means is further adapted to store a relationship of the temperature dependent resonant frequency characteristic of the crystals dependent on the temperature and the cut angle,
wherein said processing means further comprises a frequency deviation determining means adapted to read out from said memory means a frequency deviation dependent on said determined cut angle and an ambient temperature value measured by a temperature sensor;
wherein said second crystal oscillator setting means is adapted to disable said third control signal and said first/second control signal setting means is adapted to set said first control signal and said second control signal to a value corresponding to said read out frequency deviation to tune said first and said second crystal oscillator back to their center frequencies.

29. A device for temperature compensation via a determination of the cut angle of crystals used in oscillators, comprising:
a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) at least one second crystal oscillator
including a second crystal which is cut under the same angle as said first crystal and which thus has the same resonant frequency temperature characteristic as said first crystal;
adapted to output a second oscillation frequency with a second oscillation frequency temperature characteristic, and including a second tuning means for tuning said second oscillation frequency in response to a second and third control signal, said second tuning means tuning said second oscillation frequency to a predetermined second center frequency when said second control signal has a second default value; and said second oscillation frequency temperature characteristic being identical to said first oscillation frequency temperature characteristic when said third control signal is disabled and being detuned thereto when it is enabled;

c) a second crystal oscillator setting means for enabling and setting said third control signal to a control value dependent of a temperature;

d) a processing means
including a first/second control signal setting means for setting said first control signal and said second control signal to their default values;
at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
a memory means for storing a known relationship of the frequency ratio parameter dependent on the temperature and the cut angle; and
an access means for accessing said memory means with said temperature and said determined frequency ratio parameter and for reading out the cut angle corresponding thereto, and e) wherein said second tuning means comprises a first and second tuning unit, said first tuning unit being controlled by said second control signal and said second tuning unit being controlled by said third control signal, and f) wherein said first tuning unit comprises a voltage tunable capacitor, wherein said first control signal is a voltage signal having a predetermined voltage level; and g) wherein each of said first and second tuning units comprises a voltage tunable capacitor, wherein said second and third control signals are voltage signals having predetermined voltage levels; and h) wherein said second tuning means is formed by a single voltage tunable capacitor, wherein said second and third control signals are voltage signals, and by a voltage combiner network combining the second and third control voltage to form a single control voltage for said single voltage tunable capacitor.

30. A device for temperature compensation via a determination of the cut angle of crystals used in oscillators, comprising:

a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;

b) at least one second crystal oscillator
including a second crystal which is cut under the same angle as said first crystal and which thus has the same resonant frequency temperature characteristic as said first crystal,
adapted to output a second oscillation frequency with a second oscillation frequency temperature characteristic, and
including a second tuning means for tuning said second oscillation frequency in response to a second and third control signal, said second tuning means tuning said second oscillation frequency a predetermined second center frequency when said second control signal has a second default value; and
said second oscillation frequency temperature characteristic being identical to said first oscillation frequency temperature characteristic when said third control signal is disabled and being detuned thereto when it is enabled;

c) a second crystal oscillator setting means for enabling and setting said third control signal to a control value dependent of a temperature;

d) a processing means
including a first/second control signal setting means for setting said first control signal and said second control signal to their default values;
at least one frequency ratio determining means for determining a frequency ratio parameter representing the frequency ratio of said second oscillation frequency to said first oscillation frequency when said first and said second control signals are set to their default values and said third signal is enabled and set to said control value corresponding to said temperature;
a memory means for storing a known relationship of the frequency ratio parameter dependent on the temperature and the cut angle; and
an access means for accessing said memory means with said temperature and said determined frequency ratio parameter and for reading out the cut angle corresponding thereto; and e) wherein there are provided a plurality of second crystal oscillators, a plurality of frequency ratio determining means and an averaging means for averaging said plurality of determined frequency ratio parameters, wherein said access means accesses said memory means with an averaged frequency ratio parameter.

31. A device for determining the identity of the cut angle of crystals used in oscillators, comprising:

a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;

b) a second crystal oscillator
including a second crystal which is cut under an angle and which has a resonant frequency temperature characteristic;
adapted to output a second oscillation frequency with a second oscillation frequency temperature characteristic; and
including a second tuning means for tuning said second oscillation frequency in response to a second control signal, said second tuning means tuning said second oscillation frequency to a predetermined second center frequency when said second control signal has a second default value;
c) said second oscillation frequency temperature characteristic being different to said first oscillation frequency temperature characteristic due to a difference in cut-angle of the first and second crystals;
d) a processing means
including a first/second control signal setting means for setting said first control signal and said second control signal to their default values;
a frequency ratio determining means for determining a frequency ratio parameter representing the frequency ratio of said second oscillation frequency to said first oscillation frequency at a measurement temperature different to the point temperature of the crystals;
memory means for storing a known relationship of the frequency ratio parameter dependent on the cut-angle of the first crystal and the cut-angle of the second crystal at said measurement temperature;
an access means for accessing said memory means with said determined frequency ratio parameter and for reading out the cut angles of the first and second crystal corresponding thereto; and
a calibration means for determining the identity of the cut-angles on the basis of the read out first and second crystal cut-angles; and
e) a temperature application means for applying said measurement temperature to each of said first and second oscillators for exposing said oscillators to said measurement temperature (e.g. t=45° C.) and/or a temperature measurement means for determining the current ambient temperature as said measurement temperature.

32. A device for determining the identity of the cut angle of crystals used in oscillators, comprising:
a) a first crystal oscillator
including a first crystal which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) a second crystal oscillator
including a second crystal which is cut under an angle and which has a resonant frequency temperature characteristic;
adapted to output a second oscillation frequency with a second oscillation frequency temperature characteristic; and
including a second tuning means for tuning said second oscillation frequency in response to a second control signal, said second tuning means tuning said second oscillation frequency to a predetermined second center frequency when said second control signal has a second default value;
c) said second oscillation frequency temperature characteristic being different to said first oscillation frequency temperature characteristic due to a difference in cut-angle of the first and second crystals;
d) a processing means
including a first/second control signal setting means for setting said first control signal and said second control signal to their default values;
a frequency ratio determining means for determining a frequency ratio parameter representing the frequency ratio of said second oscillation frequency to said first oscillation frequency at a measurement temperature different to an inflection point temperature of the crystals;
memory means for storing a known relationship of the frequency ratio parameter dependent on the cut-angle of the first crystal and the cut-angle of the second crystal at said measurement temperature;
an access means for accessing said memory means with said determined frequency ratio parameter and for reading out the cut angles of the first and second crystal corresponding thereto; and
a calibration means for determining the identity of the cut-angles on the basis of the read out first and second crystal cut-angles; and
e) wherein said memory means is adapted to store a look-up table containing pre-calculated values representing said frequency ratio parameter of said first to said second oscillation frequency dependent on the cut angles of the first and the second crystal at said measurement temperature at said measurement temperature in accordance with the first and second oscillation frequency temperature characteristic; wherein
said access means is adapted to access said memory means with said determined frequency ratio parameter determined at said measurement temperature and to read out the first and second cut angle at a stored frequency ratio parameter which has a closest match to said determined frequency ratio parameter at said measurement temperature.

33. A device for determining the identity of the cut angle of crystals used in oscillators, comprising:
a) a first crystal oscillator
including a first crystal, which is cut under an angle and which has a first resonant frequency temperature characteristic,
adapted to output a first oscillation frequency with a first oscillation frequency temperature characteristic determined by said first resonant frequency temperature characteristic, and
including a first tuning means for tuning said first oscillation frequency in response to a first control signal, said first tuning means tuning said first oscillation frequency to a predetermined first center frequency when said first control signal has a first default value;
b) a second crystal oscillator
including a second crystal which is cut under an angle and which has a resonant frequency temperature characteristic;

adapted to output a second oscillation frequency with a second oscillation frequency temperature characteristic, and including a second tuning means for tuning said second oscillation frequency in response to a second control signal, said second tuning means tuning said second oscillation frequency to a predetermined second center frequency when said second control signal has a second default value;

c) said second oscillation frequency temperature characteristic being different to said first oscillation frequency temperature characteristic due to a difference in cut-angle of the first and second crystals;

d) a processing means
   including a first/second control signal setting means for setting said first control signal and said second control signal to their default values;
   a frequency ratio determining means for determining a frequency ratio parameter representing the frequency ratio of said second oscillation frequency to said first oscillation frequency at a measurement temperature different to an inflection point temperature of the crystals;
   memory means for storing a known relationship of the frequency ratio parameter dependent on the cut-angle of the first crystal and the cut-angle of the second crystal at said measurement temperature;
   an access means for accessing said memory means with said determined frequency ratio parameter and for reading out the cut angles of the first and second crystal corresponding thereto; and
   a calibration means for determining the identity of the cut-angles on the basis of the read out first and second crystal cut-angles; and e) said frequency ratio determining means comprises
   a first counter for counting pulses of the first oscillation frequency of the first crystal oscillator,
   at least a second counter for counting pulses of the second oscillation frequency of the second crystal oscillator, and
   a maximum comparison means for comparing the first counter count value with a predetermined maximum value, wherein said processing means further comprises a reset/readout means adapted to read out the second counter count value as said frequency ratio parameter when said maximum comparison means detects that said first counter count value has reached said maximum value and for resetting said first and said second counter, wherein said access means accesses said memory means with said read out second counter count value.

* * * * *